United States Patent
Goessel et al.

(10) Patent No.: US 9,646,716 B2
(45) Date of Patent: May 9, 2017

(54) CIRCUIT ARRANGEMENT AND METHOD WITH MODIFIED ERROR SYNDROME FOR ERROR DETECTION OF PERMANENT ERRORS IN MEMORIES

(71) Applicant: Infineon Technologies AG, Neubiberg (DE)

(72) Inventors: Michael Goessel, Mahlow (DE); Sven Hosp, Potsdam (DE); Guenther Niess, Potsdam (DE); Klaus Oberlaender, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 24 days.

(21) Appl. No.: 14/447,806

(22) Filed: Jul. 31, 2014

(65) Prior Publication Data
US 2015/0039952 A1 Feb. 5, 2015

(30) Foreign Application Priority Data

Jul. 31, 2013 (DE) .................. 10 2013 215 055

(51) Int. Cl.
| | |
|---|---|
| *H03M 13/11* | (2006.01) |
| *G11C 29/10* | (2006.01) |
| *G06F 11/263* | (2006.01) |
| *G11C 29/42* | (2006.01) |
| *G06F 11/10* | (2006.01) |
| *G11C 29/04* | (2006.01) |

(52) U.S. Cl.
CPC .......... *G11C 29/10* (2013.01); *G06F 11/1048* (2013.01); *G06F 11/263* (2013.01); *G11C 29/42* (2013.01); *G11C 2029/0411* (2013.01)

(58) Field of Classification Search
CPC ..................................... H03M 13/11
USPC .................. 714/780, 781, 763, 762, 755
See application file for complete search history.

(56) References Cited

U.S. PATENT DOCUMENTS

| | | | |
|---|---|---|---|
| 5,459,740 A * | 10/1995 | Glaise ................ | H03M 13/151 714/755 |
| 6,275,965 B1 * | 8/2001 | Cox .................... | G11B 20/1833 714/755 |
| 2011/0154152 A1 * | 6/2011 | Brzezinski .......... | G06F 11/1004 714/755 |

* cited by examiner

*Primary Examiner* — Fritz Alphonse
(74) *Attorney, Agent, or Firm* — Schiff Hardin LLP

(57) ABSTRACT

A circuit arrangement for detecting memory errors is provided. The circuit arrangement comprises a memory (11) and an error detection circuit (12). The circuit arrangement is designed to store a code word of an error detection code (C) or a code word that is inverted in a subset (M) of bits in the memory (11) at a memory location and to read out a data word from the memory (11) from the memory location. The error detection circuit (12) is designed, for the case where a control signal present assumes a first value, to indicate a memory error if the data word is not a code word of the error detection code (C). Furthermore, the error detection circuit (12) is designed, for the case where the control signal present assumes a second value, which is different from the first value, and the code word that is inverted in the subset (M) of bits was written to the memory location, to determine on the basis of the data word read out from the memory (11) whether a memory error is present if the code word that is inverted in the subset (M) of bits is not a code word of the error detection code (C).

26 Claims, 10 Drawing Sheets

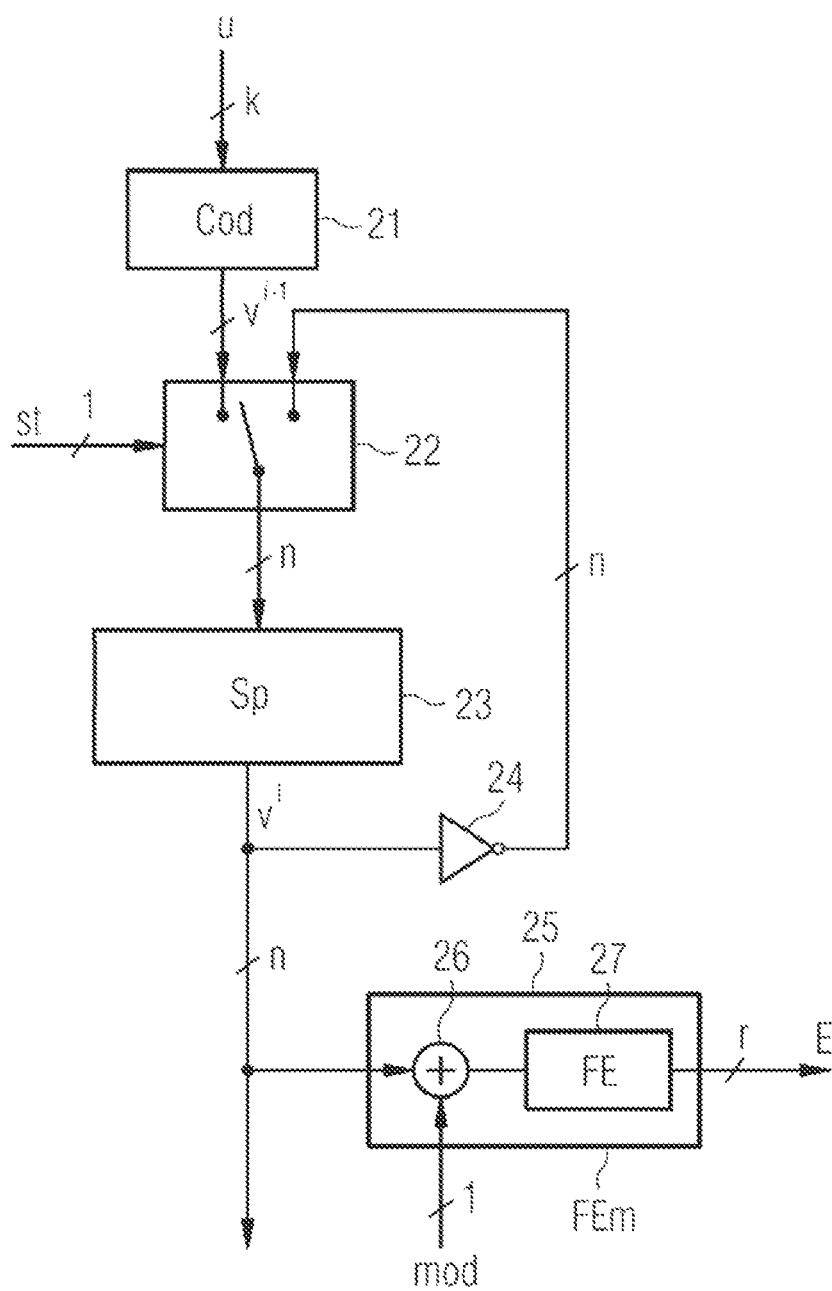

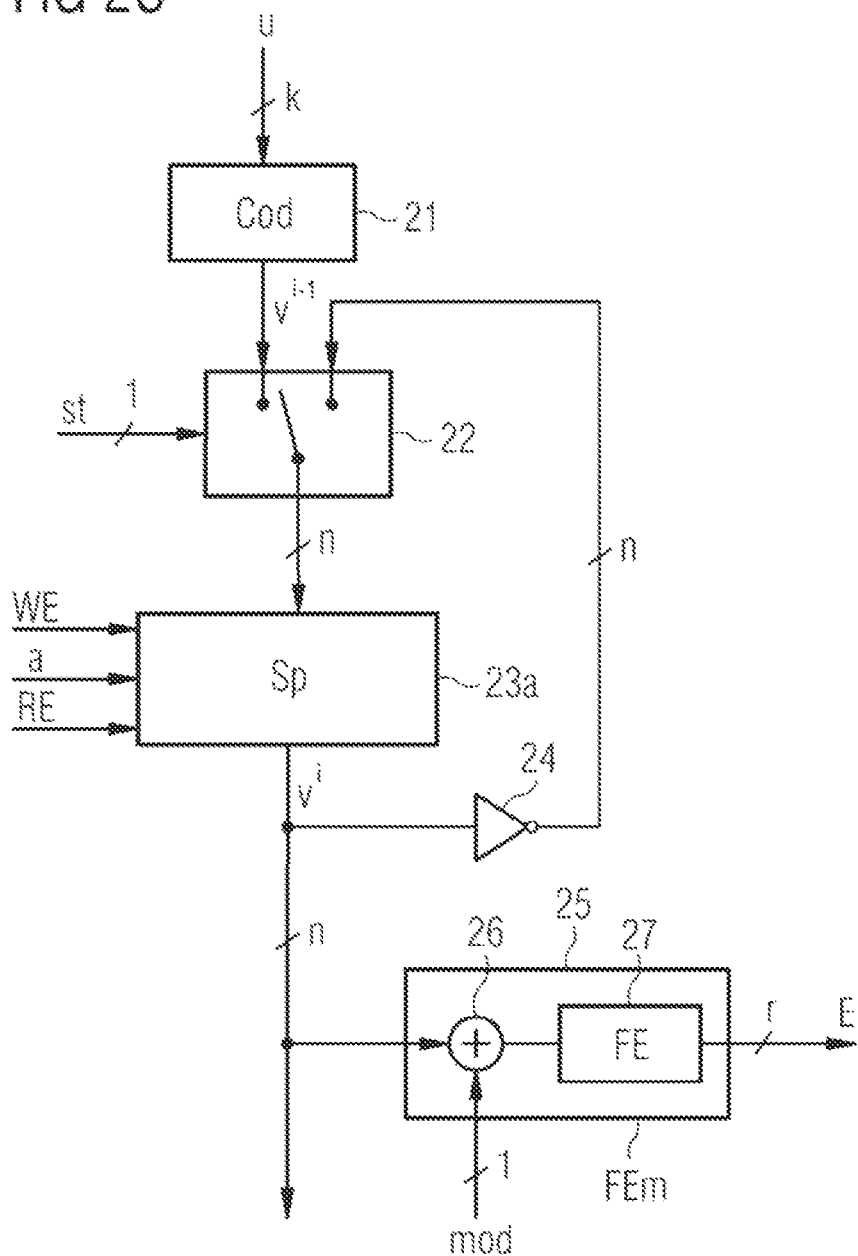

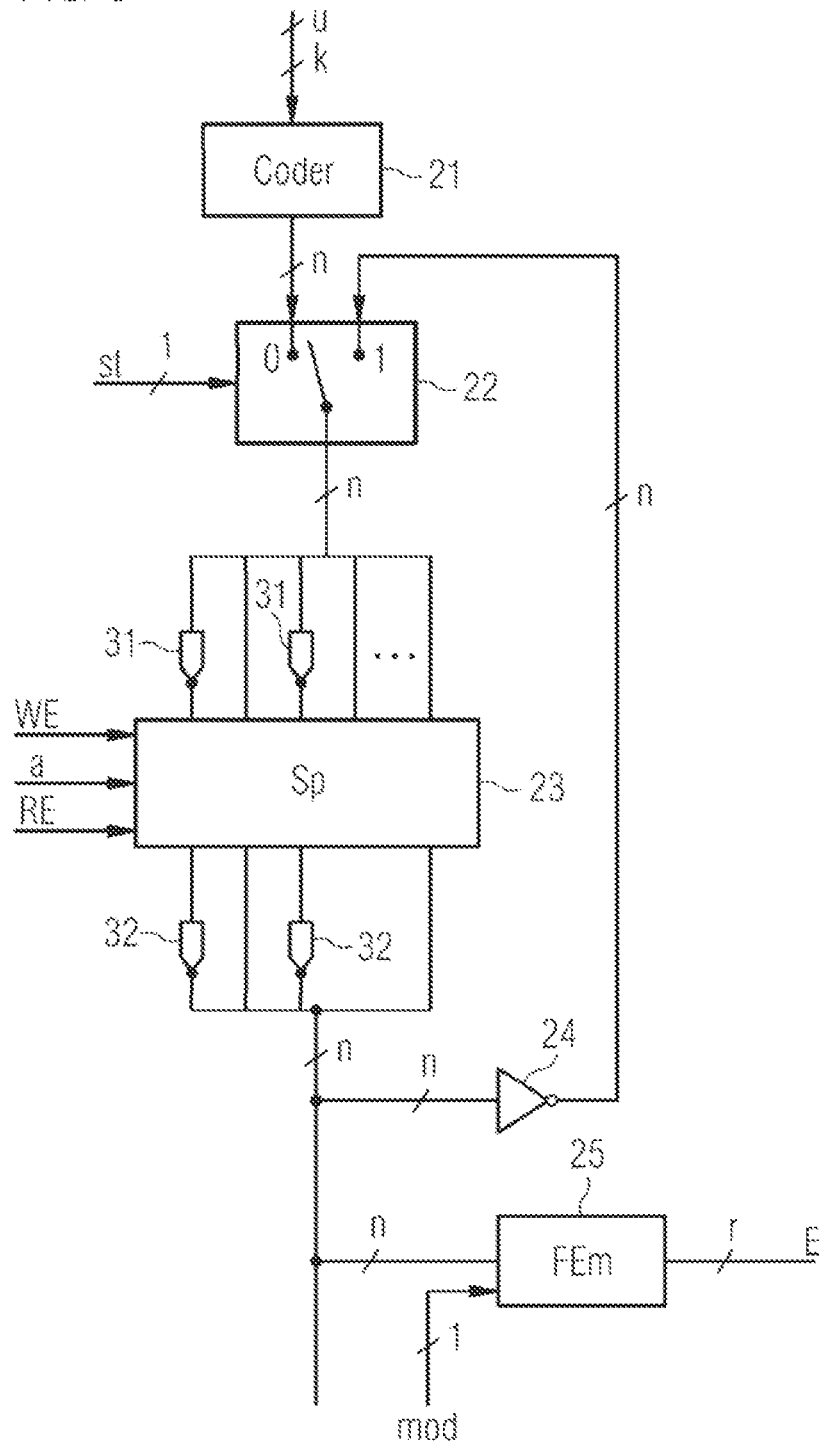

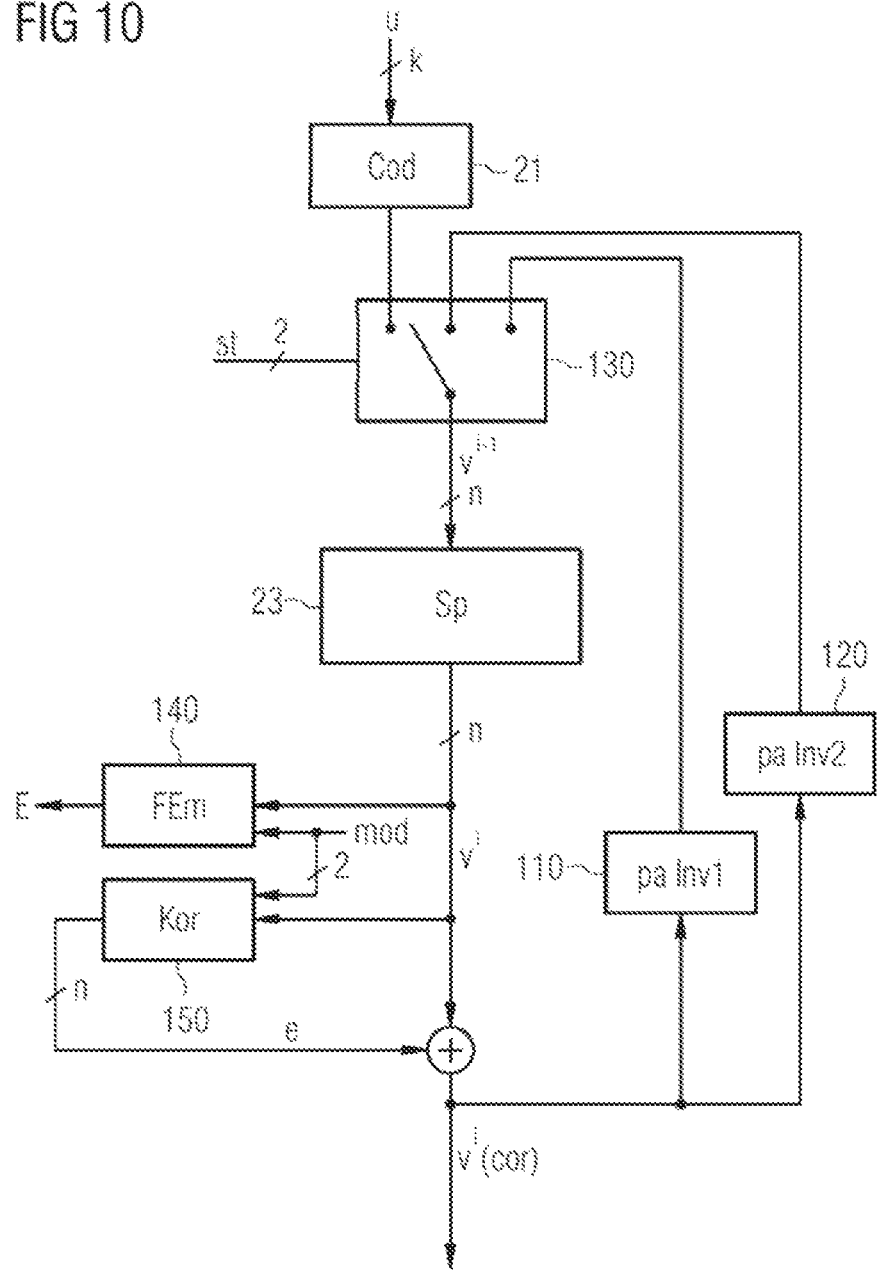

Figure 1:
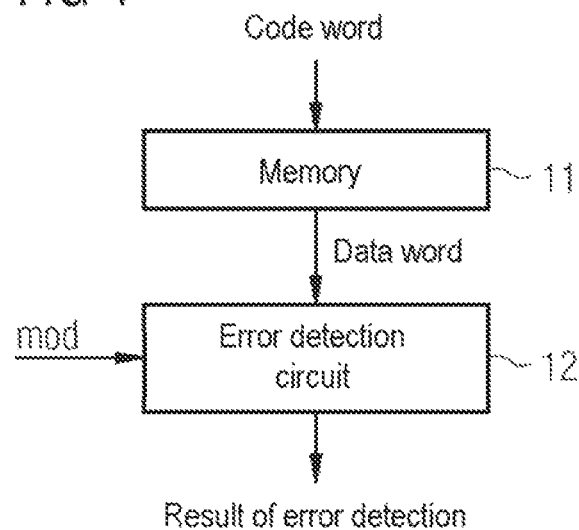

CIRCUIT ARRANGEMENT AND METHOD WITH MODIFIED ERROR SYNDROME FOR ERROR DETECTION OF PERMANENT ERRORS IN MEMORIES

The application relates to error detection, in particular error detection in semiconductor memories, and, more specifically, a circuit arrangement and a method with modified error syndrome for error detection of permanent errors in memories.

On account of the increasing high degree of integration of semiconductor memories, the frequency of errors in memories is increasing.

Semiconductor memories are increasingly also being used in safety-critical fields of application, such as in the automotive field, for instance, in which correct functioning is required.

In order to achieve the effect that the memories used are as free from errors as possible, an offline test is usually carried out before said memories are used. In this case, a specific test sequence is input into the semiconductor memory and the actual test response is compared with the expected test response. If a non-correspondence of actual and expected test responses is established, the memory is defective. In the memory to be tested, in this case the individual memory cells are written to and read in a specific way and the values read out are often accumulated to form a signature. Various memory tests are known to the person skilled in the art. Only errors that are permanently present can be found in the offline test.

Online error detection and error correction can be employed in the course of operation.

For online error detection and online error correction, error correction codes are employed in the course of operation in order to correct and detect errors. If k-bit wide data $u=u_1, \ldots, u_k$ are to be stored, then they are firstly coded as an n-bit wide code word $v=v_1, \ldots, v_n$ of an error correction code C and are written to the memory in coded form at an address a. An n-bit word $v'=v'_1, v'_2, \ldots, v'_n$ at the address a is read out from the memory. In this case, 'v' may differ from v on account of an error. If v and v' differ in B bits, then a B-bit error is present. Using the code C, B errors can then be corrected if $2 \cdot B < d$, wherein d is the code distance of the code C. If all errors in v' can be corrected, then the corresponding error that the erroneous word v' was read out instead of the correct code word v does not affect the functioning.

If the code C is used only for error detection, then d−1 errors can be detected. If a code is used for error detection and not for error correction, then the code is called an error detection code.

Online error detection and online error correction serve for detecting and correcting non-permanent errors, so-called transient or volatile errors, although of course permanent errors can also be detected and corrected.

If a permanent 1-bit error, for example a stuck-at error, arose following the offline test and if the code C can correct 1-bit errors, then the permanent 1-bit error does not affect the behavior. However, if a volatile 1-bit error now additionally occurs, then a 2-bit error may be present, which the code C can now no longer correct correctly. The permanent 1-bit error that arose has the effect that the code C no longer suffices to correct volatile 1-bit errors.

In order to achieve a high reliability, therefore, it is expedient to test a memory for permanent errors at certain time intervals. If a customary offline test is then employed, specific test sequences are to be input into the memory and the corresponding test responses are to be evaluated. What is disadvantageous here, in particular, is that the data currently stored in the memory are to be overwritten by the data of the test sequence in the offline test, such that the currently stored data, which are intended still to be used, have to be read out and temporarily stored.

In this regard, e.g. SRAM memories in complicated microcontroller products in safety-critical applications should be tested in frequent periods of time during the application in order to detect, correct and register hard, newly arising errors and soft errors in the memory. This should take place in short regular time slices. Computation time required for this is no longer available to the actual application. The less time required by the regular tests of the memories, the more time and performance is available for the actual application.

One approach would be that modules whose SRAM (Static Random Access Memory) is intended to be tested are first of all functionally switched off, that the memory is then made accessible via the bus, that the actual application content is then transferred (copied over) to a different memory that is still free, and that the memory to be tested is then tested with a predefined algorithm and/or with a predefined physical allocation. The actual content is copied back again after the test.

Transferring the original user data via a bus is very time-consuming. Moreover, such a test, which is often carried out by means of the CPU (Central Processing Unit), is often also not sufficiently suitable for simulating the critical conditions during active operation, since the CPU accesses the memory during the test via a slow bus with waiting cycles, that is to say with cycles without access to the memory, while the module that uses the memory accesses the memory, under certain circumstances, in every cycle, or in a plurality of successive cycles.

It is an object of the present invention to provide improved concepts for error detection.

A circuit arrangement for detecting memory errors is provided. The circuit arrangement comprises a memory and an error detection circuit. The circuit arrangement is designed to store a code word of an error detection code (C) or a code word that is inverted in a subset (M) of bits in the memory at a memory location and to read out a data word from the memory from the memory location. The error detection circuit is designed, for the case where a control signal present assumes a first value, to indicate a memory error if the data word is not a code word of the error detection code (C). Furthermore, the error detection circuit is designed, for the case where the control signal present assumes a second value, which is different from the first value, and the code word that is inverted in the subset (M) of bits was written to the memory location, to determine on the basis of the data word read out from the memory whether a memory error is present if the code word that is inverted in the subset (M) of bits is not a code word of the error detection code (C).

In accordance with one embodiment, the circuit arrangement can furthermore comprise n data input lines and n data output lines, wherein the circuit arrangement can be designed to read out from the memory location of the memory the data word $v'^i=v_1^i, \ldots, v_n^i$, which has n digits, onto the n data output lines, wherein in the memory location of the memory, before said data word is read out, the code word $v^{i-1}=v_1^{i-1}, \ldots, v_n^{i-1}$ of the error detection code (C), said code word being present on the n data input lines, was written to said memory location, or wherein a word $v_M^{i-1}$ having n digits was written to the memory location of the memory, wherein the word $v_M^{i-1}$ is formed by inversion of the bits of the subset (M) of bits, wherein the subset (M) of bits is a non-empty subset (M) of bits, from a code word $v^{i-1}$ of the code (C), wherein, after the word $v^{i-1}$ or the word $v_M^{i-1}$ was written to a memory location in the memory, no further data word was written to said memory location in the memory until the data word $v^i$ was read from said memory location from the memory.

In one embodiment, the code (C) can have a code distance d, d≥2, wherein i≥2 and n≥4.

In accordance with one embodiment, the error detection circuit FEm can be designed, depending on the value of the control signal (mod) present if an n-digit code word $v^{i-1}$ of the code (C) was written to the memory before the n-digit data word $v^i$ is read out, to indicate an error if the data word $v^i$ read out is not a code word of the code (C); wherein the error detection circuit FEm can be designed, if the word $v_M^{i-1}$ having n digits was written to the memory before the n-digit data word $v^i$ is read out, if $v_M^{i-1}$ is a code word of the code (C), and if M does not comprise all n bits, to indicate an error if the word $v^i$ read out from the memory is not a code word of the code (C), wherein the error detection circuit can be designed, if the word $v_M^{i-1}$ having n digits was written to the memory before the n-digit data word $v^i$ is read out, if $v_M^{i-1}$ is not a code word of the code (C), to indicate an error if the word $v_M^i$ formed from the word $v^i$ read out from the memory, said word $v_M^i$ being formed from $v^i$ by inversion of the bits belonging to the subset M, is not a code word of the code (C), wherein the control signal mod assumes the first value if a code word $v^{i-1}$ of the code (C) was input before the data word is read out, or if a word $v_M^{i-1}$ formed by inversion of the bits belonging to the subset M from a code word of the code (C) was input into the memory before the data word is read out, and if the word $v_M^{i-1}$ is a code word of the code (C), in which case $v_M^{i-1}$ is a code word of the code (C), M is a proper subset of all the bits, and wherein the control signal mod present assumes the second value, which is different from the first value, if a word $v_M^{i-1}$ formed by inversion of the bits belonging to the subset M from a code word of the code (C) was input into the memory before the data word $v^i$ is read out, and the word $v_M^{i-1}$ is not a code word of the code (C).

In one embodiment, the non-empty subset M can consist of all n bits and $v_M^{i-1} = \overline{v_1^{i-1}}, \ldots, \overline{v_n^{i-1}}$ holds true.

In accordance with one embodiment, the non-empty subset M can comprise every second bit and either $v_M^{i-1} = \overline{v_1^{i-1}}, v_2^{i-1}, \overline{v_3^{i-1}}, v_4^{i-1}, \ldots, \overline{v_{n-1}^{i-1}}, v_{n-1}^{i-1}$ or $v_M^{i-1} = v_1^{i-1}, \overline{v_2^{i-1}}, v_3^{i-1}, \overline{v_4^{i-1}}, \ldots, v_{n-1}^{i-1}, \overline{v_{n-1}^{i-1}}$ can hold true.

In accordance with one embodiment, the memory can be an addressable memory having an address input, wherein the memory location written to and the memory location read from are determined by an address.

In one embodiment, the memory can be a RAM (Random Access Memory).

In accordance with one embodiment, the memory can be an MRAM (Magnetoresistive RAM).

In one embodiment, the memory can be a register array.

In accordance with one embodiment, the memory can be a register having at least the length n of the code (C).

In one embodiment, the register can be constructed from flip-flops.

In accordance with one embodiment, the register can be constructed from latches.

In one embodiment, e.g. a digit-by-digit inverted word $\overline{v}^{i-1} = \overline{v_1}^{i-1}, \ldots, \overline{v_n}^{i-1}$ of a code word $v^{i-1} = v_1^{i-1}, \ldots, v_n^{i-1}$ is not a code word of the code (C).

In accordance with one embodiment, inverters can be connected upstream of a non-empty subset of input lines of the memory Sp and NOT circuits can be disposed downstream of the corresponding output lines of the memory Sp.

In accordance with one embodiment, the code (C) can be a nonlinear code.

In one embodiment, the code (C) can be a linear code.

In one embodiment, the code (C) can be a linear code having the length n with k data bits, and the code (C) can be an H-matrix H with k rows and n columns, wherein k<n, and wherein the error detection circuit FEm has as subcircuit a syndrome generator Syn configured such that, depending on the data $v^i = v_1^i, \ldots, v_n^i$ read out from the memory and a binary control variable mod, said syndrome generator determines a k-digit error syndrome $s(v^i)$ according to the relationship $$s(v^i) = H \cdot [v^i \oplus \text{mod} \cdot (u_1, \ldots, u_n)]^T = H \cdot (v^i)^T \oplus \{\text{mod} \cdot H \cdot (u_1, \ldots, u_n)^T\},$$

wherein mod=0 if a code word $v^{i-1}$ of the code (C) was written to the memory at the address a or if an n-digit word $v_M^{i-1}$ was written to the memory, wherein the word $v_M^{i-1}$ is formed by inversion of the bits of a non-empty subset M of bits from a code word $v^{i-1}$ of the code (C) and $v_M^{i-1}$ is a code word of the code (C), and mod=1 if an n-digit word $v_M^{i-1}$ was written to the memory, wherein the word $v_M^{i-1}$ is formed by inversion of the bits of a non-empty subset M of bits from a code word $v^{i-1}$ of the code (C) and $v_M^{i-1}$ is not a code word of the code (C), and wherein $(v_i)^T$ is an n-component binary column vector comprising the components $v_1^i, \ldots, v_n^i$ and $(u_1, \ldots, u_n)^T$ is an n-component binary column vector comprising the components $u_1, \ldots, u_n$, wherein the following holds true for i=1, ..., n:

$u_i=1$ for $u_i \in M$ and $u_i=0$ for $u_i \notin M$, and wherein $H \cdot (v^i)^T \oplus \{\text{mod} \cdot H \cdot (u_1, \ldots, u_n)^T\}$ represents the component-by-component XORing of the k-digit vectors $H \cdot (v^i)^T$ and $\{\text{mod} \cdot H \cdot (u_1, \ldots, u_n)^T\}$ and $[v^i \oplus \text{mod} \cdot (u_1, \ldots, u_n)]^T$ is the digit-by-digit XORing of the n-digit vectors $v^i$ and $\text{mod} \cdot (u_1, \ldots, u_n)^T$ and mod=1 holds true if $$H \cdot (u_1, \ldots, u_n)^T \neq 0.$$

In accordance with a further embodiment, a circuit arrangement, comprising a memory and an error detection circuit, for testing and detecting memory errors in the memory using arbitrary useful data stored in the memory is provided. The circuit arrangement is designed to write a code word of an error detection code to a memory location of the memory and to store it, wherein the circuit arrangement is furthermore designed to read out a data word stored in the memory at a memory location, and wherein the circuit arrangement is furthermore designed to invert a non-empty subset of bits of a data word which was read out from the memory and to write the read-out data word whose non-empty subset of bits were inverted to the memory location at which the read-out data word was stored. The error detection circuit is designed to indicate an error depending on a value of a control signal, wherein the error detection circuit is furthermore designed, if the control signal assumes a first value, to indicate a memory error if the data word read out from the memory is not a code word of the error detection code, wherein the error detection circuit is designed, if the control signal assumes a second value, to indicate a memory error if the data word that is read out from the memory and is inverted in the subset M of bits is not a code word of the error detection code. The control signal assumes the first value if a code word was written to the memory location of the memory from which the data word was read out. The control signal assumes the second value if the data word that is inverted in the subset M of bits and read out from the memory was written to the memory location from which the data word is read out and if a code word of the error detection code, said code word being inverted in the subset M of bits, is not a code word of the error detection code, wherein the first value of the control signal is different from the second value of the control signal, and wherein the subset M is a proper subset of all the bits of a data word if a code word that is inverted in the subset M of bits is a code word of the error detection code.

In this case, by way of example, in one embodiment, the code can be a linear code.

In one embodiment, a circuit arrangement is provided. The circuit arrangement comprises a memory, an error detection circuit, n data input lines and n data output lines. The circuit arrangement is designed to read out from the memory location of the memory the data word $v^i=v_1^i, \ldots, v_n^i$, which has n digits, onto the n data output lines, wherein in the memory location of the memory, before said data word is read out, the code word $v^{i-1}=v_1^{i-1}, \ldots, v_n^{i-1}$ of the error detection code, said code word being present on the n data input lines, was written to said memory location, or wherein a word $v_M^{i-1}$ having n digits was written to the memory location of the memory, wherein the word $v_M^{i-1}$ is formed by inversion of the bits of a non-empty subset M of bits, from a code word $v^{i-1}$ of the code, wherein, after the word $v^{i-1}$ or the word $v_M^{i-1}$ was written to a memory location in the memory, no further data word was written to said memory location in the memory until the data word $v^i$ was read from said memory location from the memory, wherein the code has a code distance d, d≥2, and i≥2 and n≥4. The error detection circuit is designed, depending on the value of the control signal (mod) if an n-digit code word $v^{i-1}$ of the code was written to the memory before the n-digit data word $v^i$ is read out, to indicate an error if the data word $v^i$ read out is not a code word of the code; and wherein the error detection circuit is designed, if the word $v_M^{i-1}$ having n digits was written to the memory before the n-digit data word $v^i$ is read out, if $v_M^{i-1}$ is a code word of the code (C), and if M does not comprise all n bits, to indicate an error if the word $v^i$ read out from the memory is not a code word of the code, wherein the error detection circuit is designed, if the word $v_M^{i-1}$ having n digits was written to the memory before the n-digit data word $v^i$ is read out, if $v_M^{i-1}$ is not a code word of the code, to indicate an error if the word $v_M^i$ formed from the word $v^i$ read out from the memory, said word $v_M^i$ being formed from $v^i$ by inversion of the bits belonging to the subset M, is not a code word of the code, wherein the control signal mod assumes the first value if a code word $v^{i-1}$ of the code was input before the data word is read out, or if a word $v_M^{i-1}$ formed by inversion of the bits belonging to the subset M from a code word of the code was input into the memory before the data word is read out, and if the word $v_M^{i-1}$ is a code word of the code, in which case $v_M^{i-1}$ is a code word of the code, the subset M is a proper subset of all the bits, and wherein the control signal mod assumes the second value, which is different from the first value, if a word $v_M^{i-1}$ formed by inversion of the bits belonging to the subset M from a code word of the code was input into the memory before the data word is read out, and the word $v_M^{i-1}$ is not a code word of the code.

In this case, by way of example, in one embodiment, the code can be a linear code.

Furthermore, in a further embodiment, a circuit arrangement for detecting memory errors is provided, wherein the circuit arrangement comprises a memory and an error detection circuit. The error detection circuit is designed for determining errors in the memory. The memory is designed to the effect that in the memory useful data bits $u=u_1, \ldots, u_k$ are stored as a code word $v=v_1, \ldots, v_n$ of a code (C) having the length n with k information bits with the code distance d≥2, wherein there are q subsets $M_1=\{v_{1,1}, \ldots, v_{1,n1}\}, \ldots, M_q=\{v_{q,1}, \ldots, v_{q,nq}\}$ where q≥1 and no≤n for i=1, ..., q of the set $M=\{v_1, \ldots, v_n\}$ of the n components of the code word $v=v_1, \ldots, v_n$, and at least one of the values $n_1, \ldots, n_q$ is less than n, wherein $M_1 \cup M_2 \cup \ldots, \cup M_k = M$ holds true and such that if $v=v_1, \ldots, v_n$ is a code word of the code (C), for i=1, ..., q it is also the case that $v^{Mi}=v_1^i, \ldots, v_n^i$ is a code word of the code (C), wherein $v^{Mi}$ is formed from v such that the components of v which are an element of $M_i$ are inverted and the components of v which are not an element of $M_i$ are not inverted. The device is designed to store, in a first step, a code word $v^1=v_1^1, \ldots, v_n^1$ of the code (C) at an address a in the memory, wherein the device is furthermore designed to read out, in a second step, a word $v^2=v_1^2, \ldots, v_n^2$ stored at the address a in the memory, wherein the device is designed to carry out the second step after the first step, and wherein, between the first step and the second step, no further word is written to the memory at the address a, wherein the error detection circuit is designed to check, in a third step, whether $v^2$ is a code word of the code (C) and, if $v^2$ is not a code word of the code (C), to indicate an error and to end the processing and, if $v^2$ is a code word of the code (C), to indicate no error and to continue the processing, wherein the device is furthermore designed to store, in a fourth step, a code word $v^3=(v^2)^{M1}$ at the address a in the memory, wherein $v^3=(v^2)^{M1}$ is determined from $v^2$ such that the components $v_i^2$ where i∈{1, ..., n} of $v^2$ which belong to $M^1$ are inverted and all the components which do not belong to $M^1$ are not inverted, if it has been established in the third step that $v^2$ is a code word of the code (C), wherein the device is furthermore designed to read out, in a fifth step, a word $v^4$ stored at the address a, wherein the device is designed to carry out the fifth step after the fourth step, and wherein, between the fourth step and the fifth step, no further word is written to the memory at the address a, and wherein the error detection circuit is furthermore designed to check, in a sixth step, whether $v^4$ is a code word of the code (C) and, if $v^4$ is not a code word of the code (C), to indicate an error and to end the method and, if $v^4$ is a code word of the code (C), to indicate no error.

Furthermore, in a further embodiment, a circuit arrangement for detecting memory errors is provided, wherein the circuit arrangement comprises a memory and an error detection circuit. The error detection circuit is designed for determining errors in the memory. The memory is designed to the effect that in the memory useful data bits $u=u_1, \ldots, u_k$ are stored as a code word $v=v_1, \ldots, v_n$ of a code (C) having the length n with k information bits with the code distance d≥2, wherein there are q subsets $M_1=\{v_{1,1}, \ldots, v_{1,n1}\}, \ldots, M_q=\{v_{q,1}, \ldots, v_{q,nq}\}$ where q≥1 and ni≤n for i=1, ..., q of the set $M=\{v_1, \ldots, v_n\}$ of the n components of the code word $v=v_1, \ldots, v_n$, and at least one of the values $n_1, \ldots, n_q$ is less than n, wherein $M_1 \cup M_2 \cup \ldots, \cup M_k = M$ holds true and such that if $v=v_1, \ldots, v_n$ is a code word of the code (C), for i=1, ..., q it is also the case that $v^{Mi}=v_1^i, \ldots, v_n^i$ is a code word of the code (C), wherein $v^{Mi}$ is formed from v such that the components of v which are an element of $M_i$ are inverted and the components of v which are not an element of $M_i$ are not inverted. The device is designed to store, in a first step, a code word $v^1=v_1^1, \ldots, v_n^1$ of the code (C) at an address a in the memory, wherein the device is furthermore designed to read out, in a second step, a word $v^2=v_1^2, \ldots, v_n^2$ stored at the address a in the memory, wherein the device is designed to carry out the second step after the first step, and wherein, between the first step and the second step, no further word is written to the memory at the address a, wherein the error detection circuit is designed to check, in a third step, whether $v^2$ is a code word of the code (C) and, if $v^2$ is not a code word of the code (C), to indicate an error and, if $v^2$ is a code word of the code (C), to indicate no error, wherein the device is furthermore designed to store, in a fourth step, which is carried out after the third step, a code word $v^3=(v^2)^{M1}$ at the address a in the memory, wherein $v^3=(v^2)^{M1}$ is determined from $v^2$ such that the components $v_i^2$ where $i \in \{1, \ldots, n\}$ of $v^2$ which belong to $M^1$ are inverted and all the components which do not belong to $M^1$ are not inverted, wherein the device is furthermore designed to read out, in a fifth step, a word $v^4$ stored at the address a, wherein the device is designed to carry out the fifth step after the fourth step, and wherein, between the fourth step and the fifth step, no further word is written to the memory at the address a, and wherein the error detection circuit is furthermore designed to check, in a sixth step, whether $v^4$ is a code word of the code (C) and, if $v^4$ is not a code word of the code (C), to indicate an error and, if $v^4$ is a code word of the code (C), to indicate no error.

In this case, by way of example, in one embodiment, the code can be a linear code.

Furthermore, a method for detecting memory errors is provided, wherein the method comprises:

storing a code word of an error detection code (C) or a code word that is inverted in a subset (M) of bits in the memory at a memory location, reading out a data word from the memory from the memory location, indicating a memory error if the data word is not a code word of the error detection code (C), if a control signal assumes a first value, and for the case where the control signal assumes a second value, which is different from the first value, and the code word that is inverted in the subset (M) of bits was written to the memory location, determining on the basis of the data word read out from the memory whether a memory error is present if the code word that is inverted in the subset (M) of bits is not a code word of the error detection code (C).

Furthermore, a method for determining errors in a memory Sp is provided, in which useful data bits $u=u_1, \ldots, u_k$ are stored as a code word $v=v_1, \ldots, v_n$ of an (n,k)-code C with the code distance $d \geq 3$, wherein there are q subsets $M_1=\{v_{1,1}, \ldots, v_{1,n1}\}, \ldots, M_q=\{v_{q,1}, \ldots, v_{q,nq}\}$ where $q \geq 1$ and $n_i \leq n$ for $i=1, \ldots, q$ of the set $M=\{v_1, \ldots, v_n\}$ of the n components of the code word $v=v_1, \ldots, v_n$, wherein $M_1 \cup M_2 \cup \ldots, \cup M_k = M$ holds true and such that if $v=v_1, \ldots, v_n$ is a code word of the code (C), for $i=1, \ldots, q$ it is also the case that $v^{Mi}=v_1^i, \ldots, v_n^i$ is a code word of the code (C), wherein $v^{Mi}$ is formed from v such that the components of v which are an element of $M_i$ are inverted and the components of v which are not an element of $M_i$ are not inverted, characterized in that the method comprises at least the following method steps:

1. storing a code word $v^1=v_1^1, \ldots, v_n^1$ of the code C at an address a in the memory Sp,
2. reading out a word $v^2=v_1^2, \ldots, v_n^2$ stored at the address a in the memory Sp, wherein this second step is carried out after the first step, and wherein, between the first step and the second step, no further word was written to the memory at the address a,
3. checking whether $v^2$ is a code word of the code C, wherein, if $v^2$ is not a code word of the code C, an error is indicated and the method can be ended, and wherein, if $v^2$ is a code word of the code C, no error is indicated and the method is continued,
4. if it has been established in the third step that $v^2$ is a code word of the code C, storing a code word $v^3=(v^2)^{M1}$ at the address a in the memory Sp, wherein $v^3=(v^2)^{M1}$ is determined from $v^2$ such that the components $v_i^2$ where $i \in \{1, \ldots, n\}$ of $v^2$ which belong to $M^1$ are inverted and all the components which do not belong to $M^1$ are not inverted,
5. reading out a word $v^4$ stored at the address a, wherein the fifth step is carried out after the fourth step and, between the fourth step and the fifth step, no further word is written to the memory Sp 13 at the address a, and
6. checking whether $v^4$ is a code word of the code C, wherein, if $v^4$ is not a code word of the code C, an error is indicated and the method can be ended, and wherein, if $v^4$ is a code word of the code C, no error is indicated.

Furthermore, provision is made of a method for determining errors in a memory, in which useful data bits $u=u_1, \ldots, u_k$ are stored as a code word $v=v_1, \ldots, v_n$ of a code (C) having the length n with k information bits and with the code distance $d \geq 2$, wherein there are q subsets $M_1=\{v_{1,1}, \ldots, v_{1,n1}\}, \ldots, M_q=\{v_{q,1}, \ldots, v_{q,nq}\}$ where $q \geq 1$ and $n_i \leq n$ for $i=1, \ldots, q$ of the set $M=\{v_1, \ldots, v_n\}$ of the n components of the code word $v=v_1, \ldots, v_n$, wherein $M_1 \cup M_2 \cup \ldots, \cup M_k = M$ holds true and such that if $v=v_1, \ldots, v_n$ is a code word of the code (C), for $i=1, \ldots, q$ it is also the case that $v^{Mi}=v_1^i, \ldots, v_n^i$ is a code word of the code (C) and at least one of the values $n_1, \ldots, n_q$ is less than n, wherein $v^{Mi}$ is formed from v such that the components of v which are an element of $M_i$ are inverted and the components of v which are not an element of $M_i$ are not inverted, wherein the method comprises at least the following steps:

in a first step, storing a code word $v^1=v_1^1, \ldots, v_n^1$ of the code (C) at an address a in the memory, in a second step, reading out a word $v^2=v_1^2, \ldots, v_n^2$ stored at the address a in the memory, wherein this second step is carried out after the first step, and wherein, between the first step and the second step, no further word was written to the memory at the address a, in a third step, checking whether $v^2$ is a code word of the code (C), wherein, if $v^2$ is not a code word of the code (C), an error is indicated and wherein, if $v^2$ is a code word of the code (C), no error is indicated, in a fourth step, storing a code word $v^3=(v^2)^{M1}$ at the address a in the memory, wherein $v^3=(v^2)^{M1}$ is determined from $v^2$ such that the components $v_i^2$ where $i \in \{1, \ldots, n\}$ of $v^2$ which belong to $M^1$ are inverted and all the components which do not belong to $M^1$ are not inverted, in a fifth step, reading out a word $v^4$ stored at the address a, wherein the fifth step is carried out after the fourth step and, between the fourth step and the fifth step, no further word is written to the memory at the address a, and in a sixth step, checking whether $v^4$ is a code word of the code (C), wherein, if $v^4$ is not a code word of the code (C), an error is indicated and wherein, if $v^4$ is a code word of the code (C), no error is indicated.

Furthermore, a computer program comprising a program code for carrying out the above methods is provided.

Embodiments use the MBIST unit (Memory Built-In Self Test Controller) that is present anyway for test purposes after manufacture. In addition, they use the ECC (Error Correction Code) detection and correction unit (an ECC unit) that is present anyway for reliability purposes. Said unit corrects or indicates one- and two-bit errors during operation.

Both units together, the MBIST unit and the ECC unit, can preferably be used in combination with an online test during the operating time. The MBIST unit allows a fast writing and reading access to the memory for normal test purposes anyway, and the ECC unit is very well suited to detecting possible errors for any data words.

In order to prevent the time-consuming copying over of user code, in accordance with embodiments the MBIST unit can be designed to run over the entire memory content in a reading manner. The ECC unit can be designed to find errors present in the memory, and then to register them in the memory that is present anyway for addresses of erroneous words (this memory can be used e.g. as a type of mini-cache during the test of the memory, in order to mask erroneous SRAM words there by software installation after each boot process from the Flash by means of this mini-cache).

One problem which then arises is that, if the user code is used, so-called hard "stuck-at" errors are possibly not found if such an error has the same polarity as the user bit at this point. In the case of a stuck-at error, a signal level, contrary to its desired function, assumes the same value continuously, e.g. continuously 0 (stuck at 0) or continuously 1 (stuck at 1). In a normal MBIST test, therefore, a plurality of tests with different data contents and polarities are allowed to run over the memory in order nevertheless to find these errors. That does not work, of course, with the user code.

Embodiments now use a more efficient concept: during reading, the complete user word is inverted and written back to the memory in the next cycle. This is done for all words in the memory in pass 1. In this case, all errors of a specific polarity are found simultaneously by the ECC decoder.

Then, with the now completely inverted memory content, the procedure is started a second time and all of the now inverted words are read out again, the ECC decoder is used again for error detection and the word for each address is inverted and it is therefore written back again in an inverted fashion.

After this second pass, the original content of the memory has been re-established and, nevertheless, simple hard and soft 1- and 2-bit and even, depending on the algorithm, all three-bit stuck-at errors have been found (errors having both polarities). In addition, the memory content has been completely maintained by the use of this concept, i.e. no complex, time-consuming copying over is required. Each address is read exactly 2× and written to 2× as a result.

In a specific further embodiment, a partial word of the memory content is inverted such that the partially inverted word is a valid code word. In the second step, a second partial word is in turn inverted such that the partially inverted word is again a valid code word. The two partial inversions are carried out such that each bit is inverted at least once. A modification of the ECC circuit (the ECC unit) is not necessary with this method. This affords slight time advantages, particularly important in applications that are very time-critical, in particular time-critical in the sense of the cycle time. This is done for all words in the memory in passes 1 and 2. The third pass guarantees that the user data are written back correctly. In other words, the third pass is performed such that the user data are written back again such that all of the bits assume their original value again.

With the concept of this specific further embodiment, all errors of a specific polarity are found by the ECC decoder. After the $3^{rd}$ pass, the original content of the memory has been re-established and, nevertheless simple hard and soft 1-and 2-bit and even, depending on the algorithm, all three-bit stuck-at errors have been found (errors having both polarities) and the memory content has been completely maintained by the use of this concept. In embodiments, with the use of this concept, each address is written to exactly three times, and each address is read from exactly three times.

The concepts described above are particularly time-efficient and provide a very fast test (much faster than via a slow bus by the CPU). Hardware, area and power already present for other purposes are used for the test described above. The concepts described above are particularly advantageous for frequent, regular tests of memories during the operating time.

Embodiments provide an ECC code which is "symmetrical" for this nondestructive test, that is to say which is an "invertible" code which leads to the same result in both polarities (single fault, double fault). Such a symmetrical code therefore has the property that each code word, if it is inverted bit by bit, becomes a code word again. That is possible by skillful selection of the code and possibly by extension by one bit, if necessary.

In the case of codes which require an additional bit, this requirement would also necessitate a memory wider by one bit, which leads to additional overhead area and power. In preferred embodiments, this additional bit is not required. Of particular interest here is the data width 32, which with the general symmetrical embodiment carries an 8-bit ECC instead of the normal 7-bit ECC. This constitutes an area disadvantage of 1/39. It is possible here, in one specific embodiment, for the original code width to be maintained and, during inversion, for the syndrome generator in the ECC decoder to be slightly influenced.

This method makes it possible to realize e.g. a 32-bit data word with 7 ECC check bits which nevertheless has all the positive advantages of the general method. Thus, the same positive properties as for the abovementioned "symmetrical" codes are generally also achieved for "non-symmetrical" codes.

One important field of application of the embodiments described above also arises in the case of Cross Parity Codes and codes used in the current draft of the Aurix family, e.g. with regard to the Hsiao Code, for example the "shortened Hsiao" code.

The concepts described above can be applied to arbitrary linear codes and, if appropriate, also to nonlinear codes.

Some embodiments realize inversion twice during reading with subsequent immediate, inverted writing back ("modified signature"). Other embodiments ("inverting partial word") realize selective inversion three times during reading with subsequent immediate writing back. Embodiments can use an MBIST unit present, an ECC unit present and user code/data for the online user test during the application with full user data retention and without the user data being swapped out/in.

Embodiments realize finding of hard and soft 1-, 2- and 3-bit errors. Furthermore, some of the embodiments realize a possible correction of soft errors by additional software (SW) and Error Tracking Registers that are possibly already present in safety-critical applications (safety applications). Embodiments provide a fast test which is particularly advantageous in particular in relation to copying over user data and user code. Particular advantages are afforded for safety applications with frequent tests of the memory during the operating time of the application, a normal CPU performance being maintained. The specific embodiment which provides for reading three times and writing three times, in contrast to the embodiment with the read access twice and the write access twice, has, however, a 50 percent test time disadvantage (three passes instead of two passes).

One important advantage arises from the fact that no further requirements have to be made of the original linear code.

In particular embodiments, an MBIST unit addresses the memory with a finite state machine. In this case, in one specific embodiment, a counter could be provided in order to generate continuous addresses at the memory. Other, more complex variants for generating the memory addresses are conceivable.

Furthermore, an ECC decoder can be provided, which is designed to detect errors during reading from the memory. Erroneous addresses are written to error tracking registers. Data are inverted and written back. This process of reading and inverted writing is repeated, such that the original data are present in the memory at the end. An arbitrary linear code can be used to detect both polarities of errors with arbitrary predefined user data. During the reading of the user data inverted once, the syndrome generator is modified by a control signal.

In the specific embodiment that provides for reading three times and writing three times, in each case only one partial word is inverted during the reading of the user data that are selectively inverted once or twice.

A far-reaching use of the data currently stored in the memory and of the error detection circuit present for online error detection for the test is provided in embodiments.

Embodiments of the invention are described with reference to the drawings.

Figure 2A:
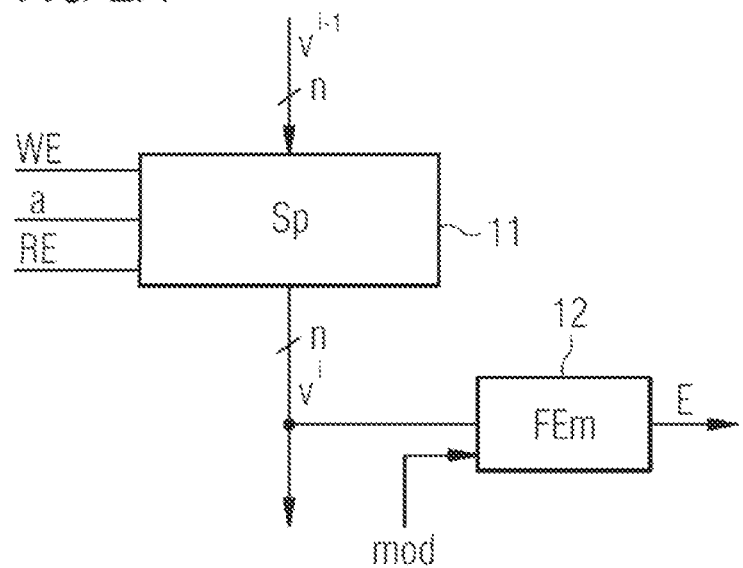
Figure 4:
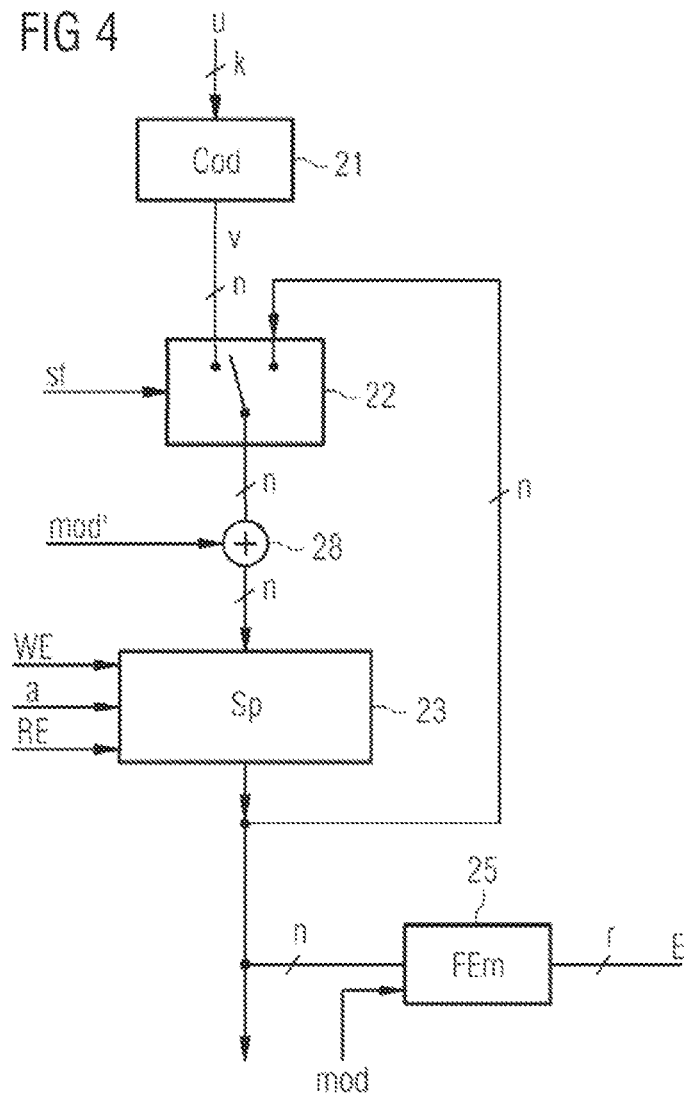
Figure 5:
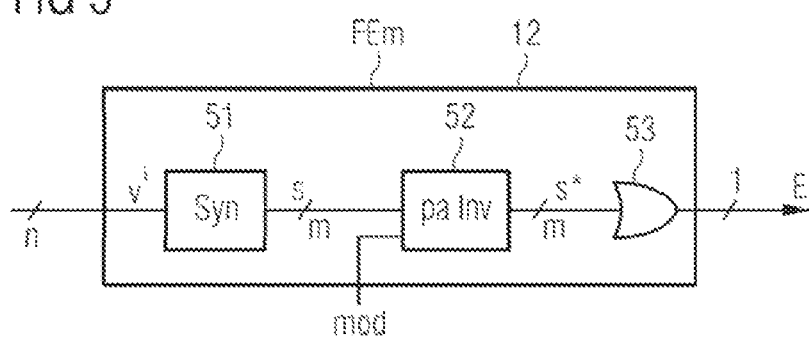
Figure 6:
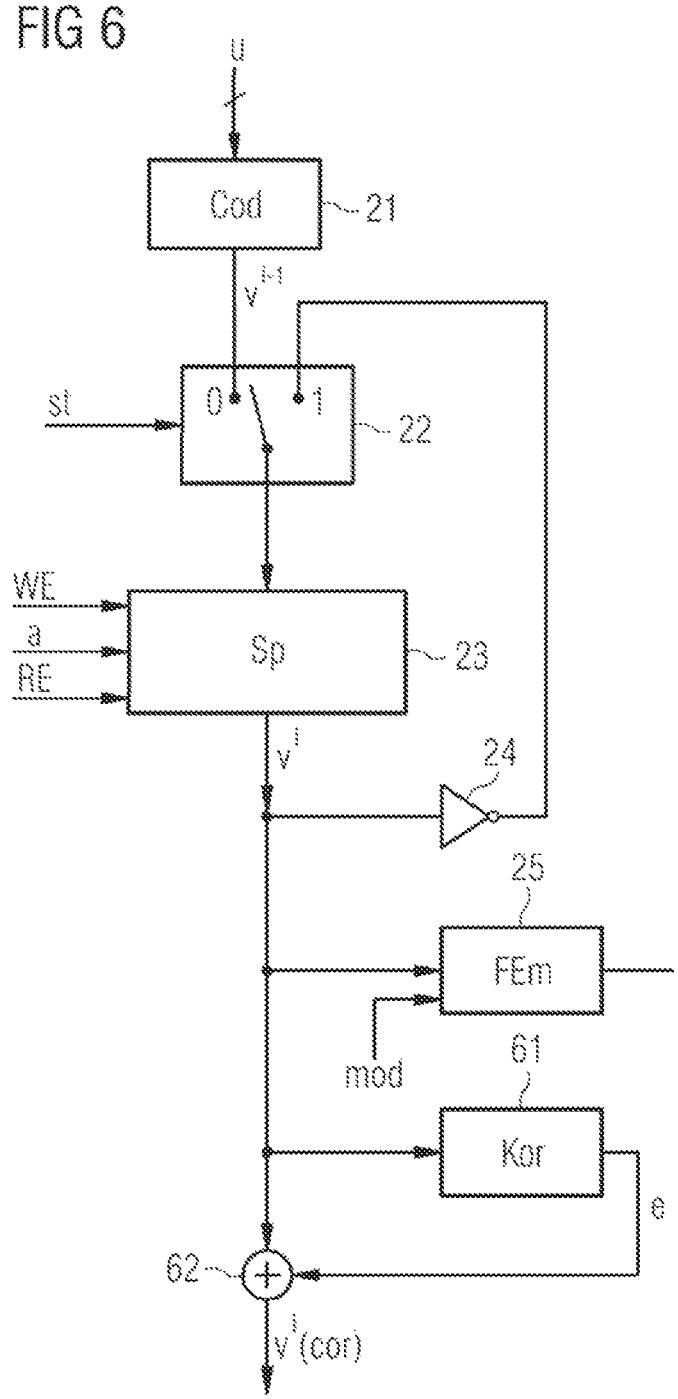
Figure 7:
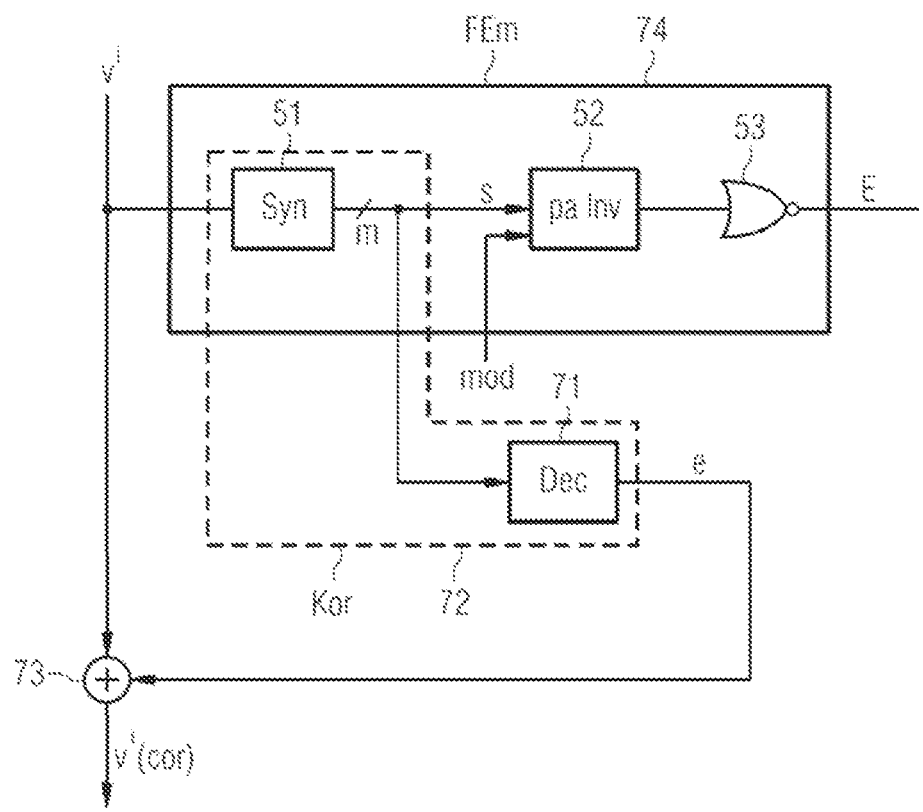
Figure 8:
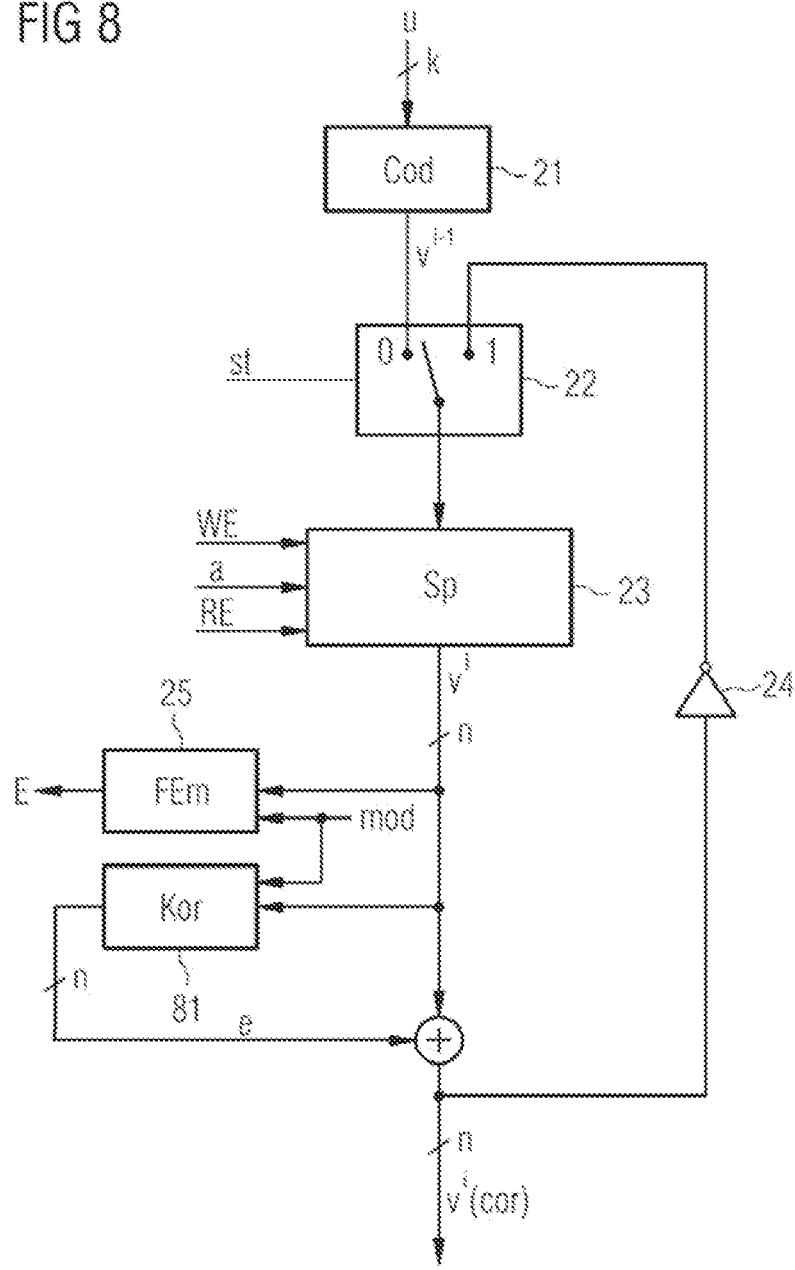
Figure 9:
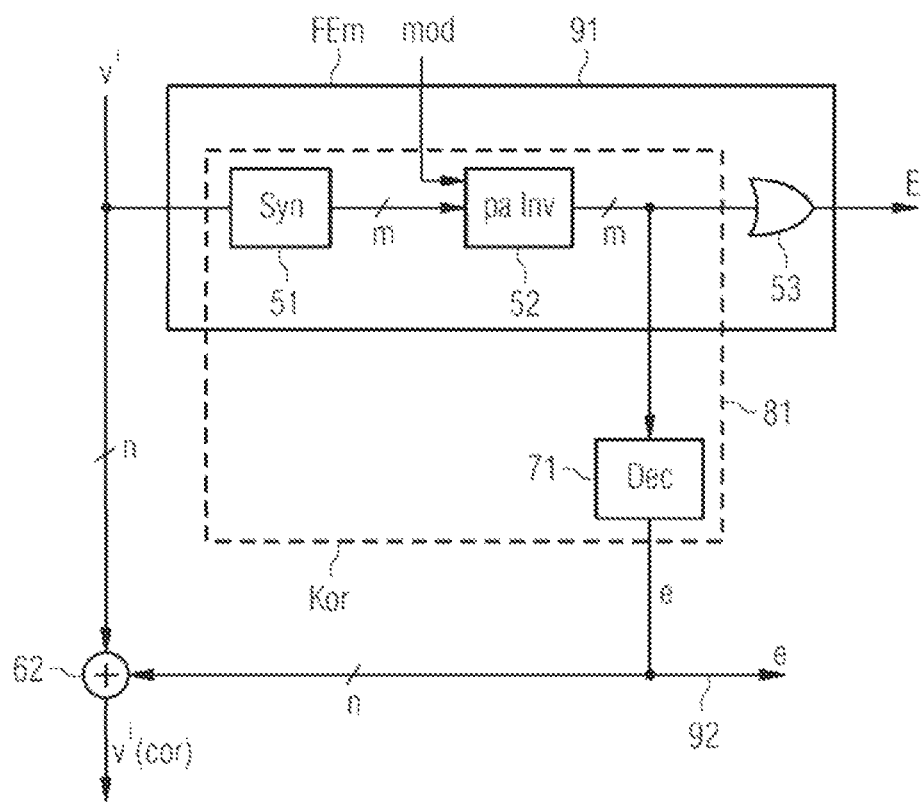

The drawings illustrate:

FIG. 1 shows a circuit arrangement for detecting memory errors in accordance with one embodiment, FIG. 2a shows an error detection circuit according to the invention connected to a memory, FIG. 2b shows one exemplary embodiment of a circuit arrangement for error detection, FIG. 2c shows one exemplary embodiment of a circuit arrangement comprising an addressable memory, FIG. 3 shows one configuration of a circuit arrangement for error detection in which a subset of input lines and of output lines of a memory are inverted, FIG. 4 shows a further specific configuration of a circuit arrangement for error detection, FIG. 5 shows one specific configuration of an error detection circuit, FIG. 6 shows one specific configuration wherein an error correction circuit is also present besides an error detection circuit, FIG. 7 shows one specific configuration wherein an error detection circuit according to the invention together with an error correction circuit are implemented, FIG. 8 shows one specific configuration of an error detection and correction circuit which indicates possible error positions, FIG. 9 shows one specific configuration of an error detection and correction circuit implemented jointly, FIG. 10 shows one exemplary embodiment of a circuit arrangement for error detection and error correction in which the inversion of the memory word is effected in two steps.

FIG. 1 shows a circuit arrangement for detecting memory errors in a memory test, using the current data stored in the memory, in accordance with one embodiment. The circuit arrangement comprises a memory 11 and an error detection circuit 12.

A circuit arrangement for detecting memory errors is provided. The circuit arrangement comprises a memory 11 and an error detection circuit 12. The circuit arrangement is designed to store a code word of an error detection code C or a code word that is inverted in a subset M of bits in the memory 11 at a memory location and to read out a data word from the memory 11 from the memory location.

The error detection circuit 12 is designed, for the case where a control signal present assumes a first value, to indicate a memory error if the data word is not a code word of the error detection code C. Furthermore, the error detection circuit 12 is designed, for the case where the control signal present assumes a second value, which is different from the first value, and the code word that is inverted in the subset M of bits was written to the memory location, to determine on the basis of the data word read out from the memory 11 whether a memory error is present if the code word that is inverted in the subset M of bits is not a code word of the error detection code C.

The control signal (mod) present at the error detection circuit 12 indicates, for example, whether a code word should be stored at the memory location (by means of a first value of the control signal) or whether a non-code word should be stored at the memory location (by means of a second value of the control signal). That is to say that if what should be stored at the memory location was a code word, then the control signal assumes a first value, for example. However, if what should be stored at the memory location was a non-code word, then the control signal assumes a second value, for example, which is different from the first value.

The term "data word" used here denotes what was read out from the memory 11 from the memory location. What is read out from the memory 11 from the memory location can be a code word or actually also not a code word. By way of example, a code word may have been stored at the memory location, and this code word is corrupted, such that a non-code word is read out. Alternatively, a case is present in which, for example, no code word at all was stored at the memory location. In this case, if the stored code word is not corrupted, likewise no code word is read out. Therefore, the term "data word" encompasses both the case where the data word is a code word and the case where the data word is not a code word.

Before some specific embodiments are described in detail, firstly some fundamental terms and relationships in coding theory will be described. The fundamental terms are known to the person skilled in the art, and they are furthermore described in text books, for example in the book Lin, S. Costello D. "Error Control Coding", Prentice Hall, 1983, to which reference is expressly made, and attention shall be drawn here in particular to pages 51-81.

Firstly, the case will be described below in which a code C is a linear error correction (n,k) code with the code distance d, with the generator matrix G and the H-matrix H, although embodiments can also be employed using nonlinear codes.

Code words of the form $v_1, \ldots, v_n$ of the codes C have the word length n, since they have n bits. A code word $v = v_1, \ldots, v_n$ can be formed from the k data bits $u = u_1, \ldots, u_k$ according to the relationship $$v = v_1, \ldots, v_n = (u_1, \ldots, u_k) \cdot G$$

wherein the (k, n)-matrix G is the generator matrix of the code C.

If the generator matrix G has the form $G=(I_k, P_{k,n-k})$, then it is in systematic form. In this case, $I_k$ is the k-dimensional unit matrix, and the (k,n-k)-matrix $P_{k,n-k}$ is called the parity matrix of the code C.

The H-matrix H is an (n−k,n)-matrix. The following holds true in systematic form:

$$H=(P_{n-k,k}^T, I_{n-k}),$$

wherein $P_{n-k,k}^T$ is the transpose matrix of the parity matrix $P_{n-k,k}$ which is determined by interchanging columns and rows from $P_{k,n-k}$. $I_{n-k}$ is the (n−k)-dimensional unit matrix. The code then has m=n−k check bits.

For a linear code C it is known that the following holds true:

If $v=v_1, \ldots, v_n$ and $w=w_1, \ldots, w_n$ are code words of the linear code C, then $y=y_1, \ldots, y_n=w \oplus v=w_1 \oplus v_1, \ldots, w_n \oplus v_n$ is likewise a code word of the code C.

If, for the code word $w=w_1, \ldots, w_n$, it holds true that $w_i=0$, then $y_i=v_i$, and if it holds true that $w_i=1$, then $y_i=v_i \oplus 1=\bar{v}_i$.

The following arises as a special case: if $$\text{All}-1 = \underbrace{1, \ldots, 1}_{n}$$

is code word of the code C,
then $(\text{All}-1) \oplus v=1 \oplus v_1, \ldots, 1 \oplus v_n=\bar{v}_1, \ldots, \bar{v}_n$ is likewise a code word of the code C if v is a code word of the code C.

If $$\text{All}-1 = \underbrace{1, \ldots, 1}_{n}$$

is not a code word of the code C,
then $(\text{All}-1) \oplus v=1 \oplus v_1, \ldots, 1 \oplus v_n=\bar{v}_1, \ldots, \bar{v}_n$ is likewise not a code word of the code C, if v is a code word of the code C.

Errors can be detected and corrected using the H-matrix H and the error syndrome s.

If $v'=v'_1, v'_2, \ldots, v'_n$ is a word having the length n, then $$s^T=(s_1, \ldots, s_m)^T=H \cdot (v')^T$$

is the error syndrome of the word v'. In this case, $s^T$ is the transpose column vector of the row vector $s=s_1, \ldots, s_m$ and $(v')^T$ is the transpose column vector of the row vector $v'=v'_1, v'_2, \ldots, v'_n$ wherein m=n−k holds true.

The error syndrome of a vector v' is equal to $$0 = \text{All}-0 = \underbrace{0, \ldots, 0}_{m},$$

precisely if v' is a code word of the code C.

If $v'=v'_1, v'_2, \ldots, v'_n$ is an n-digit binary word, $v=v_1, \ldots, v_n$ is a code word of the code C and it holds true that $$e=e_1, \ldots, e_n=v \oplus v'=v_1 \oplus v'_1, \ldots, v_n \oplus v'_n,$$

then the error syndrome of v' is determined solely by e and it holds true that $$s^T=H \cdot (v')^T = H \cdot (v \oplus e)^T = H \cdot e^T.$$

In this case, e is called the error vector. If $e_i=1$ holds true for a component, then v' in the i-th component $v'_i$ differs from the i-th component $v_i$ of the code word v. If $e_j=0$ holds true for a component, then v' does not differ in the j-th component $v'_j$ from the j-th component $v_j$ of the code word v.

If C is a B-bit error correction code, then the error syndromes for all 1-bit, 2-bit, . . . , B-bit errors are different in pairs, and the error correction can be performed unambiguously on the basis of the error syndrome if only 1-bit, 2-bit, . . . B-bit errors have occurred.

The distance between two words $v=v_1, \ldots, v_n$ and $w=w_1, \ldots, w_n$, which is also called the Hamming distance, is equal to the number of their components in which they differ. The distance d of a code is equal to the minimum distance between two of its code words.

If C is a linear code having the code distance d, then it holds true for all 1-bit, 2-bit, . . . (d−1)-bit errors that the error syndrome s is not equal to 0.

We will consider a linear (n,k)-code C having the length n and k information bits and having a code distance d≥3. Examples of such codes are Hamming codes having a code distance d=3, Hsiao codes and Odd-Even codes having a code distance of 4 and BCH codes.

A code word $v=v_1, \ldots, v_n$ is determined from the k information bits as $$v=v_1, \ldots, v_n = u \cdot G = (u_1, \ldots, u_k) \cdot G$$

wherein $$G = \begin{pmatrix} g_1 \\ g_2 \\ \vdots \\ g_k \end{pmatrix}$$

and $g_1, \ldots, g_k$ are n-digit row vectors.

We will consider two cases:
1. If $v=v_1, \ldots, v_n$ is a code word of the code C, then $\bar{v}=\bar{v}_1, \ldots, \bar{v}_n$ is likewise a code word of the code C.
2. If $v=v_1, \ldots, v_n$ is a code word of the code C, then $\bar{v}=\bar{v}_1, \ldots, \bar{v}_n$ is not a code word of the code C.

The following procedure is possible for determining errors in a memory:

A code word $v^1=v_n^1, \ldots, v_n^1$ is written/stored to/in a memory Sp at an address a, the code word of a linear code C having the H-matrix H.

The word $v^2=v_1^2, \ldots, v_n^2$ is then read out at the address a. That is to say that what is present in the memory at the address a is read out. If the storage of $v^1$ has functioned correctly and no corruptions have occurred in the memory, $v^1$ should still be present at the address a. If this is not the case, then the read-out $v^2$ deviates from $v^1$. Since $v^1$ was a code word of the code, $v^2$ is also a code word of the code if no memory errors occurred. However, if $v^2$ is no longer a code word of the code, then it can certainly be deduced from this that a memory error is present. Therefore, a check is made to determine whether $v^2$ is a code word of the code C. This is done by determining $$s(v^2)=H \cdot (v^2)^T = H \cdot (e^{1,2})^T.$$

In this case, $$e^{1,2}=v^1 \oplus v^2.$$

If $s(v^2) \neq 0$, then an error was detected and further steps are not necessary.

If $s(v^2)=0$, then an error was not detected and it is assumed that $v^2=v^1$ holds true. The tests of whether the memory is defective are continued with the subsequent step, since it may be the case that a memory error did not manifest itself in the first test step. A stuck-at-0 error is possibly present, for example, at the memory position at which $v_i^1$ was stored. If the value of $v_i^1$ is itself 0, however, then this error does not manifest itself in the first step. A further test, in which, for example, the inverted value $\overline{v_i^1}$, that is to say 1, is stored at the same memory address and read again, uncovers this stuck-at-0 error, however.

Consequently, in a next step, the bits of $v^2 = v^1$ are then inverted, as a result of which $v^3$ is obtained:

$$v^3 = \overline{v^2} = \overline{v^1} = v^1 \oplus \underbrace{1, \ldots, 1}_{n}$$

$v^3$ is then written/stored to/in the memory at the address a.

$v^4$ is then read out from the memory at the address a. In other words, what is present in the memory at the address a is read out.

The following holds true for $v^4$:

$$v^4 = v^3 \oplus e^{3,4} = \overline{v^1} \oplus e^{3,4} = v^1 \oplus \underbrace{1, \ldots, 1}_{n} \oplus e^{3,4}.$$

If the storage of $v^3$ has functioned correctly and no corruptions have occurred in the memory, $v^3$ should still be present at the address a. If this is not the case, then the read-out $v^4$ deviates from $v^3$.

Since, in order to determine the syndrome $s(v^4)^T$ $$s(v^4)^T = H \cdot [(v^4) \oplus (1, \ldots, 1)]^T = H \cdot (v^4)^T \oplus H \cdot (1, \ldots, 1)^T$$

is formed and owing to $v^4 = v^1 \oplus (1, \ldots, 1) \oplus e^{3,4}$ $$s(v^4)^T = H \cdot (v^1)^T \oplus H \cdot (1, \ldots, 1)^T \oplus H \cdot (1, \ldots, 1)^T \oplus H \cdot (e^{3,4})^T$$

and thus owing to $H \cdot (v^1)^T = 0$ and $H \cdot (1, \ldots, 1)^T \oplus H \cdot (1, \ldots, 1)^T = 0$ $$s(v^4)^T = H \cdot (e^{3,4})$$

holds true, $v^3$ may or may not be a code word, and the syndrome $s(v^4)^T$ is equal to 0 precisely if $e^{3,4}$ is a code word of the code C.

If e.g. an n-bit stuck-at error is then present on the memory outputs, the $n_1$ bit positions of the components of the error vector $e^{1,2}$ in which the values $v_i^1$ differ from the stuck-at values are then equal to 1. Likewise, the $n_2$ bit positions of the components of the error vector $e^{3,4}$ in which the values $v_i^3 = \overline{v_i^1}$ differ from the stuck-at values are equal to 1. In this case, $0 \leq n_1, n_2 \leq n$ and $n_1 + n_2 = n$.

If the code C is a B-bit error detection code, then all 1-, 2-, ..., B-bit stuck-at errors are reliably detected.

A further possible procedure for determining errors in a memory results from the following considerations:

It is possible to form a word $v_M$ from a code word $v = v_1, \ldots, v_n$ of the code C by inverting the components of v which belong to the set M. In this case, $M \subseteq \{v_1, \ldots, v_n\}$ is a subset of the components of v. If $M = \{v_1, \ldots, v_n\}$, then $v_M = \overline{v_1}, \ldots, \overline{v_n}$. If $M = \{v_1, v_2\}$, for example, then $v_M = \overline{v_1}, \overline{v_2}, v_3, \ldots, v_n$.

The set M can be described by an n-component binary row vector $u = u_1, \ldots, u_n$ for which the following holds true:

For $i = 1, \ldots, n$, $u_i = 1$ if $v_i \in M$ and $u_i = 0$ if $v_i \notin M$.

The word $v_M$ can then be formed from the code word v by $$v_M = v \oplus u = v_1 \oplus u_1, \ldots, v_n \oplus u_n.$$

If u is a code word of the code C, then $v_M$ is likewise a code word of the code C. If u is not a code word of the code C, then $v_M$ is likewise not a code word of the code C. The following holds true for the error syndrome of $s(v_M)$:

$$s(v_M) = H \cdot (v \oplus u) = H \cdot v \oplus H \cdot u = H \cdot u.$$

The following procedure is possible, for example:

A code word $v^1 = v_1^1, \ldots, v_n^1$ of a linear code C having the H-matrix H is written to a memory Sp at an address a.

The word $v^2 = v_1^2, \ldots, v_n^2$ is read at the address a and a check is made to determine whether $v^2$ is a code word of the code C by determining $$s(v^2) = H \cdot (v^2)^T = H \cdot (e^{1,2})^T.$$

In this case, $$e^{1,2} = v^1 \oplus v^2.$$

If $s(v^2) \neq 0$, then an error was detected and further steps are not necessary.

If $s(v^2) = 0$, then an error was not detected and it is assumed that $v^2 = v^1$ then holds true.

Then $$v^3 = v^2 \oplus u = v^1 \oplus u$$

is formed and $v^3$ is written to the memory at the address a.

Then, $v^4$ is read out from the memory at the address a. The following holds true:

$$v^4 = v^3 \oplus e^{3,4} = v^1 \oplus u \oplus e^{3,4}$$

wherein $e^{3,4} = v^3 \oplus v^4$. The following is formed:

$$s(v^4)^T = H \cdot (v^4)^T \oplus H \cdot (u)^T = H \cdot (v^3 \oplus e^{3,4} \oplus u)^T$$
$$= H \cdot (v^1 \oplus u \oplus u \oplus e^{3,4})^T = H \cdot (e^{3,4})^T,$$

and an error is then not deduced if $e^{3,4}$ is a code word of the code C.

If $e^{3,4}$ is a code word of the code C, then it is deduced that no error is present, and $v^4$ is a code word of the code C.

Permanent stuck-at-0 and stuck-at-1 errors are then detected in the bit positions for which $u_i = 1$ holds true. Depending on what allocations are present in the non-inverted bit positions, stuck-at-0 or stuck-at-1 errors are detected in the bit positions which are not inverted by the component-by-component XORing with u.

If the set M of the bits to be inverted is chosen such that the corresponding row vector u is a code word of the code C, then $H \cdot (u)^T = 0$ and $s(v^4)$ can be determined simply as $$s(v^4) H \cdot (v^4)^T = H \cdot (v^3 \oplus e^{3,4})^T = H \cdot (e^{3,4})^T.$$

No mod signal is then required, as explained further below.

A further word $v_{M^1}$ where $M^1 \neq M$ can then be formed, wherein the set $M^1$ is described by a row vector $u^1 = u_1^1, \ldots, u_n^1$ for which $i = 1, \ldots, n$ holds true.

Then, $u_i^1 = 1$, if $v_i \in M^1$ holds true, and $u_i^1 = 0$ if $v_i \notin M^1$ holds true.

It is possible to choose the vector $u^1$ for example such that $u^1$ is a code word of the code C. If C is a systematic code, then that can be done simply by choosing arbitrary information bits as a code word as 1 and choosing 0 for the remaining information bits and determining the associated check bits via the generator matrix of the code. The choice of the correct check bits thus ensures that $u^1$ is a code word of the code.

If no error is detected during read-out, a further word $v_{M^2}$ where $M^2 \neq M$ can be formed, wherein the set $M^2$ is described by a row vector $u^2 = u_1^2, \ldots, u_n^2$ for which, for $i=1, \ldots, n$, it holds true that $u_i^2 = 1$ if $v_i \in M^2$ holds true, and that $u_i^1 = 0$ if $v_i \notin M^2$ holds true.

By way of example, $u^2$ can again be chosen as a code vector of the code C. It is possible to continue in this way until, for example, all bits of $v_1, \ldots, v_n$ have been inverted at least once.

If it holds true after the k-th step that $$\{v_1, \ldots, v_n\} = M \cup M^1 \cup M^2 \cup \ldots \cup M^K,$$

then each bit of the vector v is inverted at least once, and it is possible to detect permanent stuck-at-0 errors and permanent stuck-at-1 errors in each bit position. If the code C is a B-bit error detection code, then all 1-, 2-, ..., B-bit stuck-at errors are reliably detected.

Specific exemplary embodiments will now be explained with reference to the drawings.

FIG. 2a illustrates an addressable memory Sp 11, at the n-bit-wide input of which an n-digit data word $v^{i-1} = v_1^{i-1}, \ldots, v_n^{i-1}$ is present.

If the write-enable signal WE is activated and an address a is present on the address line, then the data word $v^{i-1}$ is written to the corresponding memory cells of the memory Sp at the address a.

If the read-enable signal is activated at a later point in time and the address a is present, then the word stored at the address a is read out from the corresponding memory cells, such that a data word $v^i = v_1^i, \ldots, v_n^i$ is output on the n output lines of the memory Sp 11.

If no further data word is written to the memory at the address a between the writing of $v^{i-1}$ and the read-out of $v^i$, then $v^i = v^{i-1}$ if no error has occurred. If an error has occurred, for example a stuck-at error on the input lines or on the output lines of the memory Sp, then $v^i \neq v^{i-1}$ may hold true. In this case, the data word $v^{i-1}$ that is input is a code word of a code C.

The error detection circuit FEm 12 checks whether $v^i$ is a code word of the code C. If no error has occurred, then $v^i = v^{i-1}$ holds true and $v^i$ is a code word.

If an error that leads to an output non-code word $v^i$ has occurred in the memory, then this error is detected by the error detection circuit FEm 12 and indicated by the r-bit-wide error signal $E = E_{error}$. In this case, the word width of the error signal $r \geq 1$. The control signal mod of the error detection circuit FEm 12 here assumes a first value, e.g. the binary value mod=0.

If the data word $v^{i-1}$ that is input is a digit-by-digit inverted code word of the code C and not a code word of the code C and if no error occurs, then the output component-by-component inverted word $\bar{v}^i$ is a code word of the code C.

The error detection circuit FEm 12 then checks whether the component-by-component inverted word $\bar{v}^i$ is a code word of the code C. The control signal mod here assumes a second value, e.g. the binary value mod=1. If an error that leads to a non-code word $\bar{v}^i$ has occurred in the memory, then this error is detected by the error detection circuit FEm 12 and indicated by the r-bit-wide error signal $E = E_{error}$. In this case, $r \geq 1$.

In other words: the error detection circuit FEm 12 can have an input mod. If a first value (e.g. 0) is present at said input, then this indicates that a code word of the code was stored at the address a with the word $v^{i-1}$ and that therefore the output word $v^i$ is also a code word of the code if no error has occurred. By contrast, if a second value (e.g. 1) is present at the input, then this indicates that precisely no code word of the code was stored at the address a with the word $v^{i-1}$. If no error has occurred, then the output word $v^i$ is not a code word of the code. In this case, however, the component-by-component inverted word $\bar{v}^i$ that arises if the word $v^i$ is inverted component-by-component is a code word of the code.

If no error occurs, then the signal $E = E_{nonerror}$ is output by the error detection circuit FEm 12.

The inputting of a code word in the first step of a test, for example, and the inputting of the component-by-component inverted code word in the second step of a test into the memory allow, for example, arbitrary individual stuck-at-0 or stuck-at-1 errors to be detected, since the presence of such an error in the case of one of the mutually inverted words that are input leads to an erroneous output.

If the data word $v^{i-1}$ that is input is a digit-by-digit inverted code word of the code C and likewise a code word of the code C, then the error detection circuit FEm 12 checks whether the data word $v^i$ that is output is a code word of the code C. In this case, it suffices for the control signal mod to assume only one value.

The error detection described can be used particularly advantageously in a test if the memory Sp 11 is not required in the program flow, wherein it is not necessary for the data stored in the memory Sp 11 on account of the program state to be replaced by specific test data, which is advantageous.

It is assumed here that the data stored in the memory Sp 11 are coded with an error detection code C. If the data are coded with an error correction code, then the code is used only as an error detection code in the test, which results in a high error coverage.

The procedure will now be explained with reference to FIG. 2b.

The circuit arrangement illustrated in FIG. 2b consists of a coder Cod 21 having k binary inputs and n binary outputs, which are led into the first, n-bit-wide data input of a multiplexer 22 having two n-bit-wide data inputs, an n-bit-wide data output and a 1-bit-wide control input, which carries a control signal st.

The n-bit-wide output of the multiplexer 22 is connected to the n-bit-wide data input of a memory Sp 23 having an n-bit-wide data output.

The data output of the memory Sp 23 is simultaneously connected to the second data input of the multiplexer 22 via an inverter circuit 24 and to a first n-bit-wide input of an error detection circuit FEm 25, at whose second, 1-bit-wide input the control signal mod is present and at whose r-bit-wide output an r-bit-wide error signal E is output.

The inverter circuit 24 can be realized by n inverters, for example, which are connected to each of the data output lines of the memory Sp 23 and the respective outputs of which are led into the second n-bit-wide data input of the multiplexer 22.

The error detection circuit FEm 25 in FIG. 2b is constructed from an error detection unit FE 27 and an XOR circuit 26 connected upstream, wherein the XOR circuit 26 is constructed from n XOR gates $XOR_i$, $i=1, \ldots, n$ each having two inputs and one output. The 1-bit-wide control signal mod is present at each first input of each of the n XOR gates. For $i=1, \ldots, n$ the i-th component of the overall n-bit-wide data output of the memory Sp 23 is led into the second input of the XOR gate $XOR_i$. The outputs of the n XOR gates are connected to the n inputs of the error detection circuit FE. The error detection unit FE 27 checks whether the signal present at its n inputs is a code word of the code C. If a code word is present at its inputs, then it outputs an error signal $E_{nonerror}$.

If a non-code word is present at its inputs, then it outputs an error signal $E_{error}$.

The functioning of the circuit arrangement from FIG. 2b will now be described.

In the normal functional mode, the memory is occupied by code words and code words are read out from the memory Sp if no error has occurred.

This functional mode will now be explained.

If the control signal st of the multiplexer 22 is equal to 0, then the output of the coder Cod 21 is connected to the data input of the memory Sp 23 via the multiplexer 22. If a k-bit-wide data word $u=u_1, \ldots, u_k$ is then present at the input of the coder Cod, then the coder Cod 21 forms from the data word a code word $v_1, \ldots, v_n$ of the code C, which is present on the input lines of the memory Sp 23 via the multiplexer 22 and is stored at a specific memory location of the memory Sp 23. The data word stored at said memory location is then output on the data output lines of the memory Sp 23.

If no error is present, then the read-out word is a code word of the code C. If the control signal mod is equal to 0, then no error is indicated by the error detection circuit FEm 25 since the signal output from the memory Sp is not modified by the XOR gates 26 and the error detection unit FE 27 outputs an error signal $E=E_{nonerror}$ which indicates that a code word is present.

If an error is present which corrupts a code word of the code C into a non-code word of the code C and if the control signal mod of the error detection circuit FEm is equal to 0, then the error detection unit FE 27 outputs an error signal $E=E_{error}$ indicating that a non-code word is present.

In the normal functional mode, the memory Sp 23 is occupied by data which are code words in the error-free case.

In a test mode, the circuit arrangement can then detect permanent errors, such as, for example, stuck-at errors on the data input lines or the data output lines, which will now be described.

A word $v^i$ that was stored at a specific memory location is read out from the memory Sp 23, the code word $v^{i-1}$ having been written at a previous point in time. The control signal mod of the error detection circuit FEm 25 is equal to 0 in this case. If the read-out word $v^i$ is a code word of the code C, then the error detection circuit FE indicates no error at its output. The control signal st of the multiplexer 22 is then chosen as st=1 and the word $v^i$ output by the memory Sp, this word being a code word, is inverted component-by-component by the inverter circuit 24 and is written as a bit-by-bit inverted code word to the memory at the same location. The word then stored, which is a bit-by-bit inverted code word of the code C in the error-free case, is then read out. Two cases are then possible depending on the code C used.
1. The bit-by-bit inverted code word $v^i$ is not a code word of the code C.
2. The bit-by-bit inverted code word $v^i$ is a code word of the code C We will first consider the case where the bit-by-bit inverted code word $v^i$ is not a code word of the code C.

The control signal of the error detection circuit FEm 25 is chosen as mod=1 and the word read out from the memory Sp 23 is present at the input of the error detection circuit FEm 25. It is inverted bit-by-bit in the XOR circuit 26. If no error is present, then the code word that is inverted bit-by-bit twice overall is again a code word of the code C and the error detection unit FE 27 outputs no error signal.

If a detectable error is present, then it is detected by virtue of the fact that the word that is read out from the memory Sp 23 and is inverted bit-by-bit is not a code word of the code C, which is detected by the error detection unit FE 27.

The case will now be considered where a bit-by-bit inverted code word is again a code word of the code C. In this case, since the bit-by-bit inverted code word $v^i$ is again a code word of the code C, it suffices to use only one control signal mod, for example the control signal mod=0. The XOR circuit can then simply be omitted.

If an error that leads to a non-code word is present, then the error is detected at the output of the error detection circuit FEm 25 by an error signal $E_{error}$. If no error is detected, then the read-out word $v^i$ is a code word of the code C.

In this case, the memory Sp 23 illustrated in FIG. 2b can be an addressable memory such as a RAM, a register file or simply a register having a word width that is equal to the length n of the code C. The register can be constructed from flip-flops or latches, for example, and the output of the memory Sp 23 can for example be led to a bus or be connected to a CPU.

The circuit arrangement in FIG. 2c differs from the circuit arrangement in FIG. 2b in that the memory 23 in FIG. 2b is realized as an addressable memory Sp 23a in FIG. 2c. In FIG. 2c, the addressable memory Sp 23a has an address input, which carries the address signal a, an input for a read-enable signal RE, and an input for a write-enable signal WE.

Otherwise, the circuit construction of the circuit arrangement in FIG. 2c corresponds to the circuit arrangement in FIG. 2b, and, therefore, it will not be described in detail again.

The functioning of the circuit arrangement in FIG. 2c will now be described using the read-enable and write-enable signals and the address signal.

In the normal functional mode, the memory is occupied by code words and code words are read out from the memory Sp if no error has occurred.

If the control signal st of the multiplexer 22 is equal to 0, then the output of the coder Cod 21 is connected to the data input of the memory Sp 23a via the multiplexer 22. If a k-bit-wide data word $u=u_1, \ldots, u_k$ is present at the input of the coder Cod, then the coder Cod 21 forms from the data word a code word $v=v_1, \ldots, v_n$ of the code C, which is present on the input lines of the memory Sp 23a via the multiplexer 22 and, if the write-enable signal WE is activated and an address a is present at the address input, is written to the memory Sp 23a at the address a.

If the read-enable signal RE is active and an address a is present at the address input of the memory Sp 23a, then the word stored at the address a is read out. If no error is present, then the read-out word is a code word of the code C. If the control signal mod is equal to 0, then no error is indicated by the error detection circuit FEm 25 since the signal output from the memory Sp 23a is not modified by the XOR gates 26 and the error detection unit FE 27 outputs an error signal $E=E_{nonerror}$ indicating that a code word is present.

If an error is present which corrupts a code word of the code C into a non-code word of the code C and if the control signal mod of the error detection circuit FEm 25 is equal to 0, then the error detection unit FE 27 outputs an error signal $E=E_{error}$ indicating that a non-code word is present.

In the normal functional mode, the memory Sp 23*a* is occupied by data which are code words in the error-free case.

In a test mode, the circuit arrangement can then detect permanent errors, such as, for example, stuck-at errors on the data input lines or the data output lines, which will now be described.

A word $v^i$ is read out from the memory Sp 23*a*, the code word $v^{i-1}$ having been written at a previous point in time at an address a. The control signal mod of the error detection circuit FEm 25 is equal to 0 in this case. If the read-out word $v^i$ is a code word of the code C, then the error detection unit FE 27 indicates no error at its output.

The control signal st of the multiplexer 22 is then chosen as st=1 and the word $v^i$ output by the memory Sp, this word being a code word, is inverted component-by-component by the inverter circuit 24 and is written as a bit-by-bit inverted code word to the memory at the same address a. The word then stored at the address a, which is a bit-by-bit inverted code word of the code C in the error-free case, is then read out. Two cases are then possible depending on the code C used.

1. The bit-by-bit inverted code word $v^i$ is not a code word of the code C.
2. The bit-by-bit inverted code word $v^i$ is a code word of the code C We will first consider the case where the bit-by-bit inverted code word $v^i$ is not a code word of the code C.

The control signal of the error detection circuit FEm 25 is chosen as mod=1 and the word read out from the memory Sp 23*a* is present at the input of the error detection circuit FEm 25. It is inverted bit-by-bit in the XOR circuit 26. If no error is present, then the code word that is inverted bit-by-bit twice overall is again a code word of the code C and the error detection unit FE 27 outputs no error signal.

If a detectable error is present, then it is detected by virtue of the fact that the word that is read out from the memory Sp 23*a* and is inverted bit-by-bit is not a code word of the code C, which is detected by the error detection unit FE 27.

The case will now be considered where a bit-by-bit inverted code word is again a code word of the code C. In this case, since the bit-by-bit inverted code word $v^i$ is again a code word of the code C, it suffices to use only one control signal mod, for example the control signal mod=0. The XOR circuit 26 can then simply be omitted.

By virtue of an address a of the memory being applied and the read-enable signal being activated, a data word at the address a is read out, wherein the control signal mod has the value mod=0, for example. If an error that leads to a non-code word is present, then the error is detected at the output of the error detection circuit FEm 25 by an error signal $E_{error}$. If an error is not detected, then the read-out word $v^i$ is a code word of the code C.

A modification of the circuit arrangement in FIG. 2*b* is illustrated in FIG. 3.

Those circuit sections in FIG. 3 which correspond to the described circuit sections in FIG. 2*b* are designated in FIG. 3 by the same reference signs as in FIG. 2*b*, and will not be described again.

In contrast to FIG. 2*b*, a subset of the n output lines of the multiplexer 22 are connected to the corresponding data input lines of the memory Sp 23 via NOT circuits 31 (inverters 31), which invert e.g. the signal values present on their respective input line. The corresponding data output lines are likewise led via inverters 32 and are inverted by said inverters 32, wherein the circuit outputs are connected to the corresponding inputs of the inverter circuit 24 and to the corresponding inputs of the error detection circuit FEm 25.

If, by way of example, a code word v is output by the coder 21 and is output at the output of the multiplexer 22 if the control signal st of the multiplexer 22 is equal to 0, then the components of v which are connected to the corresponding data inputs of the memory 23 via an inverter 31 are inverted and stored in the memory Sp 23.

By way of example, the first binary output and the third binary output of the multiplexer 22 shall be connected to the first and third binary data inputs of the memory 23 via a respective inverter 31.

If the code word $v=v_1, v_2, \ldots, v_n$ is output by the coder Cod 21, then the word $v'=\overline{v_1}, v_2, \overline{v_3}, v_4, v_5, \ldots, v_n$ is stored in the memory Sp 23 at the address a if the write-enable signal WE is active and the address a is present at the address input.

If the read-enable signal RE is then active and the address a is present at the address input, then if no error has occurred, the word $v'=\overline{v_1}, v_2, \overline{v_3}, v_4, v_5, \ldots, v_n$ stored in the corresponding memory cells is output via the inverters of the first and third data output lines, such that the word $$\overline{\overline{v_1}},v_2,\overline{\overline{v_3}},v_4,v_5,\ldots,v_n=v_1,v_2,v_3,v_4,v_5,\ldots,v_n=v$$

is available at the circuit output and at the inputs of the inverter circuit 24 and of the error detection circuit FEm 25.

Such a use of inverters 31 and 32 may be advantageous since it allows the detection of memory errors which have the effect that all the memory cells erroneously assume the value 0, for example, which then results as an error detectable by the error detection circuit FEm 25 if the word 0 that is inverted at the positions in which inverters are provided is not a code word of the code C.

A further modification of the circuit arrangement in FIG. 2*b* is illustrated in FIG. 4.

Those circuit sections in FIG. 4 which correspond to the already described circuit sections in FIG. 2*b* are designated in FIG. 4 by the same reference signs as in FIG. 2*b* and will not be described again.

In contrast to FIG. 2*b*, the inverter circuit 24 in FIG. 2*b* is replaced by the controlled XOR circuit 28, wherein the XOR circuit 28 is constructed from n XOR gates each having two inputs and one output.

The respective first input of the n XOR gates 28 is connected to a respective binary output of the multiplexer 22, while the respective second input of the XOR gates is connected to the control unit, which carries the signal mod'. Therefore, if the signal mod'=1, then the signal output at the output of the multiplexer 22 is written to the memory 23 in inverted form.

The n outputs of the XOR gates are connected to the n data inputs of the memory Sp 23.

By way of example, if a corresponding control signal St is present at the multiplexer 22, the n-bit-wide word can be output by the outputs of the multiplexer 22 and the n components of the n-bit-wide word v are present at the n first inputs of the n XOR gates. Furthermore, the signal mod' can be present at the n second inputs of the n XOR gates.

Firstly, the value of the signal mod' can assume for example a first value, e.g. 0. The word v then remains unchanged and is written to n memory cells of the memory 23. The n memory cells from the memory 23 are then read. The n read-out values of the n memory cells are then present at the error detection circuit FEm 25. Furthermore, a control signal mod is present at the error detection circuit FEm 25, which control signal for example likewise assumes the abovementioned first value, e.g. 0, and thereby indicates that the signal mod' having the first value 0 was applied to the XOR circuit 28 when the data word v was XORed there. The error detection circuit FEm 25 then performs error detection using this information of the control signal mod.

Furthermore, the n values read out from the memory cells are present at the multiplexer 22 as it were with feedback. The signal mod' can then be set to a second value, for example to the value 1. The control signal st of the multiplexer can then be changed such that, instead of the n-bit-wide word v, the n values of the n memory cells read out from the memory 23 are switched through to the XOR circuit 28. Since the signal mod' then assumes the value 1, the n values read out from the n memory cells are then in each case XORed with 1, that is to say inverted. The values thus inverted are then in turn written to the n memory cells of the memory 23. Afterward, the values of the n memory cells are once again read out and the read-out values are then present at the error detection circuit FEm 25. Furthermore, the control signal mod present at the error detection circuit FEm 25 is to be set to the abovementioned second value 1, thereby indicating to the error detection circuit FEm 25 that the signal mod' having the second value 1 was applied to the XOR circuit 28, that is to say that inversion was carried out at the XOR circuit 28.

The temporal order has to be taken into consideration in this sequence. In order to invert the "fed-back" read-out n values of the n memory cells, the signal mod' has to be set to the value 1 before the "fed-back" read-out n values of the n memory cells pass through the XOR circuit 28. At this point in time, however, the read-out n values of the n memory cells are still present in their "non-inverted form" at the error detection circuit FEm 25. Therefore, care should be taken to ensure that the control signal mod of the error detection circuit FEm 25 is set from 0 to 1 at the correct point in time.

In one embodiment, e.g. the control signal mod of the error detection circuit FEm 28 is set to the value 1 later than the signal mod'.

In another embodiment, e.g. the signal mod' of the XOR circuit 28 and the control signal mod of the error detection circuit FEm 25 are set from 0 to 1 simultaneously, but it is ensured, e.g. by means of a corresponding clock signal at the error detection circuit FEm 25, that the error detection circuit FEm 25 performs error detection on the basis of the new value 1 of the control signal mod only when the then inverted values have been read out from the memory and are present at the error detection circuit FEm 25.

FIG. 5 shows one specific configuration of an error detection circuit FEm 12 from FIG. 2a for a binary linear error detection code C.

The error detection circuit FEm 12 comprises a syndrome generator Syn 51, a partial inverter paInv 52 and an OR circuit 53.

The n binary outputs of the memory Sp 11 are connected, as illustrated in FIG. 2a, to the input lines of the error detection circuit FEm 12, which are led into the n inputs of the syndrome generator Syn 51 and affect the m=n−k binary output lines.

The syndrome generator Syn 51 is configured such that it forms, from the binary values $v^i = v_1^i, v_2^i, \ldots, v_n^i$ present at its inputs, an m-digit syndrome $s = s_1, s_2, \ldots, s_m$ according to the relationship $$s^T = H \cdot (v^i)^T$$

wherein H is an (m,n)-check matrix of the code C, $s^T$ is a column vector having the m components $s_1, s_2, \ldots, s_m$, and $(v^i)^T$ is a column vector having n components $v_1^i, v_2^i, \ldots, v_n^i$.

The partial inverter paInv 52 is configured such that, with a deactivated mod signal, the m values of the inputs $s_1, s_2, \ldots, s_m$ are passed on directly to the outputs $s^*{=}s^*_1, s^*_2, \ldots, s^*_m$. By contrast, if the mod signal is activated, then a modified syndrome $s^* = s^*_1, s^*_2, \ldots, s^*_m$ is formed from the components $s_1, s_2, \ldots, s_m$ of the syndrome s that are present at the m inputs of said inverter. In this case, $s^*_j = s_j \oplus t_j$ or $$s_j^* = \begin{cases} s_j & \text{for } t_j = 0 \\ \overline{s_j} & \text{for } t_j = 1 \end{cases}$$

wherein $t_j$ is determined by $$t^T = (t_1, t_2, \ldots, t_m)^T = H \cdot (\underbrace{1, 1, \ldots, 1}_{n})^T$$

and t is therefore the syndrome of the data word $$(\underbrace{1, \ldots, 1}_{n}).$$

The partial inverter for j=1, 2, . . . , m paInv 52 can be realized, for example, by virtue of the fact that the j-th output line of the syndrome generator, this line carrying the component $s_j$ of the syndrome s, is connected into the first input of an XOR gate $XOR_j$ having two inputs and one output, at the second input of which the control signal mod is present and the output of which is the j-th output of the partial inverter paInv 52, if $t_j=1$. If $t_j=0$ then the j-th input line, which carries the component $s_j$ of the syndrome s, is connected directly, without inversion, to the j-th output of the partial inverter paInv 52.

The modified syndrome $s^*$ is determined from $v^i$ by the syndrome generator Syn 51 and the partial inverter paInv 52 according to the relationship $$(s^*)^T = H \cdot (v^i)^T \oplus H \cdot (1,1, \ldots ,1)^T = H \cdot (v_i \oplus (1,1, \ldots ,1))$$

The OR circuit 53 has m binary inputs and one binary output, which carries the error signal E, wherein the following holds true:

$E = 0$ for $s^* = \underbrace{0, 0, \ldots , 0}_{m}$ and $E = 1$ for $s^* \neq (0, 0, \ldots , 0).$ The OR circuit 53 can be constructed, for example, as a tree composed of OR gates having two inputs and one output, as is known to the person skilled in the art.

FIG. 6 shows one exemplary embodiment wherein the code C can be used both for error detection and for error correction.

The circuit sections in FIG. 6 which correspond to the circuit sections in FIG. 2b are provided with the same reference signs and they will not be described once again.

In addition to an error detection circuit FEm 25, in the exemplary embodiment in FIG. 6, a corrector Kor 61 is present, which is configured such that it determines, from the value $v^i$ output by the memory Sp 23, an n-digit binary correction vector $e=e_1, e_2, \ldots, e_n$, which is logically combined with the value $v^i$ output by the memory Sp 23, in an XOR circuit 62, component by component to form $v^i$(cor).

The corrector Kor 61 is used in the functional mode of the circuit.

It is not necessary to correct a value read out from the memory in the test mode, and so the corrector Kor 61 can be switched off in the test mode.

The design of a corrector Kor 61 for an error correction code C is known to a person skilled in the art.

FIG. 7 shows for one exemplary embodiment how the error detection circuit FEm 74 and a corrector Kor 72 can be realized jointly in the case of a binary code C.

In this case, the error detection circuit FEm 74 in FIG. 7 and the error detection circuit FEm 12 in FIG. 5 are constructed in the same way from subcircuits Syn 51, paInv 52 and the OR circuit 53, and so the construction of the error detection circuit FEm 74 in FIG. 7 will not be described again.

The output of the syndrome generator Syn 51 in FIG. 7 is simultaneously connected to a first n-bit-wide input of a partial inverter paInv 52 and to the n-bit-wide input of a decoder Dec 71, which is configured such that it determines, from the syndrome s present at its input, said syndrome being output by the syndrome generator, an n-bit-wide correction vector $e=e_1, e_2, \ldots, e_n$, which is XORed with $v^i$, by means of the XOR circuit 73, component by component to form the corrected word $v^i$(corr).

The corrector Kor 72 here comprises the syndrome generator Syn 51, which is also part of the error detection circuit FEm 74, and the decoder Dec 71, such that the corrector Kor 72 and the error detection circuit FEm 74 are realized jointly, which leads to a reduction of the circuit complexity and is thus advantageous.

FIG. 8 shows a modification of the circuit arrangement in FIG. 6, wherein a corrector Kor 81 determines the error vector e with the error positions both for non-inverted and for inverted memory words.

Those circuit sections in FIG. 8 which correspond to the described circuit sections in FIG. 6 are designated in FIG. 8 by the same reference signs as in FIG. 6 and are not described here again.

The error correction circuit 61, which in FIG. 6 is activated only in the operating mode and not in the test mode, is replaced in FIG. 8 by a modified error correction circuit Kor 81, which determines, for inverted code words as well, an error vector e and thus the affected erroneous memory positions.

The error correction circuit Kor 81 is configured such that it assigns an n-digit error vector $e=e_1, e_2, \ldots, e_n$ to the n-digit memory word $v^i = v_1^i, v_2^i, \ldots, v_n^i$ read out from the memory Sp 23. In this case, it is assumed, in the case of a first mod signal, that is to say mod=0, for example, that a code word was stored in the memory Sp 23; by contrast, if a second mod control signal is applied, that is to say mod=1, for example, it is assumed that an inverted code word was stored in the memory Sp 23.

The n-digit output e is logically combined with the n-digit word $v^i$ read out from the memory Sp 23, by means of an XOR circuit 62, component by component to form $v^i$(cor), and possible 1, 2, . . . , B-bit errors are thus corrected.

The corrector is used for correcting the memory word in the operating or functional mode of the circuit, and can be used in the test mode to localize the defective memory cells.

One possibility for implementing the correction circuit Kor 81 is explained with the aid of FIG. 9.

FIG. 9 shows a further joint realization of the error detection circuit FEm 91 and the error correction circuit Kor 81, wherein the corrector Kor 81 indicates the error vector e with the error positions both for non-inverted and for inverted memory words.

In this case, the error detection circuit FEm 91 and the error correction circuit Kor 81 comprise the same subcircuits, i.e. syndrome generator Syn 51, partial inverter paInv 52, OR circuit 53 and decoder Dec 71, as the error detection circuit FEm 74 and error correction circuit Kor 72 from FIG. 7.

In FIG. 9, the m-bit-wide output of the partial inverter paInv 52 is simultaneously led into the m-bit-wide input of the decoder 71 and into the m-bit-wide input of the OR circuit 53.

If the control signal mod is equal to 0, then the non-inverted output values of the syndrome generator Syn 51 are present directly at the m inputs of the decoder 71, and the decoder 71 determines an n-bit-wide correction vector $e=e_1, \ldots, e_n$, which is XORed with $v^i$, in the XOR circuit 62, to form $v^i$ (corr).

If the control signal mod is equal to 1, then $v^i$ is a data word output from the memory into which an inverted code word was input.

If no error is present, then $v^i$ is a component-by-component inverted code word of the code C.

If an error is present in the data word $v^i$ that is output, then $v^i$ differs from a component-by-component inverted code word of the code C by an error vector $e=e_1, \ldots, e_n$.

At the output of the partial inverter paInv 52, the partially inverted syndrome components of the data word $v^i$ are output, which are led into the m inputs of the decoder 71 and simultaneously into the m inputs of the OR circuit 53, which outputs an error signal E at its output.

The decoder Dec 71 forms an n-bit-wide correction vector $e=e_1, \ldots, e_n$, which is XORed with the data word $v^i$, in the XOR circuit 62, component by component to form $v^i$ (cor), wherein $v^i$ (cor) forms the corrected data word. In this case, it was assumed that the error described by the error vector e in the data word $v^i$ is an error that is correctable by the code C, such that the correction vector is identical to the error vector. For the purpose of diagnosis, the correction vector e, which is identical to the error vector in the case of an error that is correctable by the code C, can be read out at an output 92.

FIG. 10 shows a circuit arrangement when an n-digit memory 23 is protected with the aid of a coder 21, an error detection circuit FEm 140 and the error correction circuit Kor 150. A memory word can be inverted in two steps with the aid of the partial inverters paIny1 110 and paInv2 120. In this case, the n-digit output of the memory 23 is connected to the n-digit inputs of the partial inverters paIny1 110 and paInv2 120. The outputs of the partial inverters are connected to the n-digit input of the memory Sp 23 via a multiplexer 130. The partial inverters 110, 120 invert two subsets of the input lines, wherein the union of both subsets comprises all the input lines.

If the memory word is not inverted, then a control signal mod equal to 0 is present at the error detection circuit FEm 140. If the memory word is inverted with the aid of the partial inverter paInv1, then a control signal mod equal to 1 is present at the error detection circuit FEm 140, and if the memory word is inverted with the aid of the partial inverter paInv2, then a control signal mod equal to 2 is present at the error detection circuit FEm 140.

The corrector Kor 150 determines the error vector e with the error positions both for non-inverted and for partially inverted memory words, wherein the control signal mod indicates whether it is not inverted, is inverted with the aid of the first partial inverter paInv1 110 or whether it is inverted with the aid of the second partial inverter paInv2 120.

Embodiments will now be explained for specific codes.

TABLE 1

| $u_1$ | $u_2$ | $u_3$ | $u_4$ | $c_1$ | $c_2$ | $c_3$ |
|---|---|---|---|---|---|---|
| 0 | 0 | 0 | 0 | 0 | 0 | 0 |
| 0 | 0 | 0 | 1 | 0 | 0 | 1 |
| 0 | 0 | 1 | 0 | 0 | 0 | 1 |
| 0 | 0 | 1 | 1 | 0 | 1 | 0 |
| 0 | 1 | 0 | 0 | 0 | 0 | 1 |
| 0 | 1 | 0 | 1 | 0 | 1 | 0 |
| 0 | 1 | 1 | 0 | 0 | 1 | 0 |
| 0 | 1 | 1 | 1 | 0 | 1 | 1 |
| 1 | 0 | 0 | 0 | 0 | 0 | 1 |
| 1 | 0 | 0 | 1 | 0 | 1 | 0 |
| 1 | 0 | 1 | 0 | 0 | 1 | 0 |
| 1 | 0 | 1 | 1 | 0 | 1 | 1 |
| 1 | 1 | 0 | 0 | 0 | 1 | 0 |
| 1 | 1 | 0 | 1 | 0 | 1 | 1 |
| 1 | 1 | 1 | 0 | 0 | 1 | 1 |
| 1 | 1 | 1 | 1 | 1 | 0 | 0 |

Table 1 shows the code words of a Berger code, which counts the ones instead of zeros, with four data bits $u_1$, $u_2$, $u_3$, $u_4$ and three check bits $c_1$, $c_2$, $c_3$. The check bits $c_1$, $c_2$, $c_3$ are a binary representation of the number of ones of the data bits $u_1$, $u_2$, $u_3$, $u_4$. In this regard, for instance, the check bits $c_1$, $c_2$, $c_3$=0,0,0 are assigned to the data bits $u_1$, $u_2$, $u_3$, $u_4$=0,0,0,0 in row 1 and the check bits $c_1$, $c_2$, $c_3$=1,0,0 are assigned to the data bits $u_1$, $u_2$, $u_3$, $u_4$=1,1,1,1 in row 16, wherein 0,0,0 corresponds to the binary representation of 0 and 1,0,0 corresponds to the binary representation of 4.

The code is nonlinear since the component-by-component XOR sum of, for example, the code words (0001001)⊕(0010001)=(0011000) does not produce a code word of the Berger code.

The code distance of the code is 2, since the code words 0001001 and 0010001 differ in 2 bits and a new code word cannot arise only by the changing of a bit of an existing code word.

By way of example, in one specific embodiment of FIG. 2c, the coder Cod 21 in FIG. 2c, for the Berger code described, could form a code word $u_1$, $u_2$, $u_3$, $u_4$, $c_1$, $c_2$, $c_3$ according to Table 1 from the data bits $u_1$, $u_2$, ..., $u_k$=$u_1$, $u_2$, $u_3$, $u_4$.

If the control signal st of the multiplexer 22 is equal to 0, the address a is present at the address inputs and the write-enable signal WE is activated, then $v^i$=$u_1$, $u_2$, $u_3$, $u_4$, $c_1$, $c_2$, $c_3$ is stored at the address a in the memory Sp 23a. As an example, we will consider the data bits 0100, to which the check bits 001 are assigned according to Table 1, such that $v^i$=0100001 is written to the memory Sp 23a.

If then the read-enable signal RE is activated, the address a is present and a stuck-at-0 error is present on the first data line, which carries the bit $u_1$, then 0100001 is read out from the memory Sp 23a.

If then the control signal st=1, the control signal mod=0 and the write-enable signal WE is activated, then the word 0100001 is inverted into 1011110 in the inverter circuit 24 and is written to the memory Sp 23a at the address a.

Since the control signal mod=0, the read-out word 0100001 input in the error detection circuit FEm 25 is directed without being changed through the XOR circuit 26 to the input of the error detection unit FE 27, which checks whether 0100001 is a code word of the Berger code. Since this is the case, it outputs the error signal E=$E_{nonerror}$.

The read-enable signal RE of the memory Sp 23a is then activated, at the address inputs of which the address a is present. Since a stuck-at-0 error is present on the first data line, the word 0011110 is read out from the memory Sp 23a, this word being present at the input of the error detection circuit FEm 25.

The control signal mod is equal to 1 and the word 1100001 that is inverted bit-by-bit by the XOR circuit 26 is present at the input of the error detection unit FE 27, which checks whether 1100001 is a code word of the Berger code. That is not the case, and so the error detection unit FE 27 outputs an error signal E=$E_{error}$, which indicates an error. The stuck-at-0 error on the first data line has been detected.

As a further exemplary embodiment, consideration will now be given to a shortened Hamming code having three data bits $u_1$, $u_2$, $u_3$ and three check bits $c_1$, $c_2$, $c_3$ having the H-matrix $$H = \begin{pmatrix} 1 & 1 & 1 & 1 & 0 & 0 \\ 1 & 0 & 1 & 0 & 1 & 0 \\ 0 & 1 & 1 & 0 & 0 & 1 \end{pmatrix}.$$

The error syndrome s=($s_1$,$s_2$,$s_3$) is determined by $$s^T = H \cdot (u_1, u_2, u_3, c_1, c_2, c_3)^T.$$

where $$s_1 = u_1 \oplus u_2 \oplus u_3 \oplus c_1$$

$$s_2 = u_1 \oplus u_3 \oplus c_2$$

$$s_3 = u_2 \oplus u_3 \oplus c_3$$

and it holds true that $$H \cdot (1,1,1,1,1,1)^T = (0,1,1)^T.$$

The generator matrix G results in a systematic form from the H-matrix as $$G = \begin{pmatrix} 1 & 0 & 0 & 1 & 1 & 0 \\ 0 & 1 & 0 & 1 & 0 & 1 \\ 0 & 0 & 1 & 1 & 1 & 1 \end{pmatrix}.$$

By means of the G-matrix, the data bits $u_1$, $u_2$, $u_3$ result in a code word $v=v_1, v_2, \ldots v_6 = u_1, u_2, u_3, c_1, c_2, c_3$ as $$v = u \cdot G$$

and thus $$c_1 = u_1 \oplus u_2 \oplus u_3$$

$$c_2 = u_1 \oplus u_3$$

$$c_3 = u_2 \oplus u_3.$$

As an example, consideration shall be given to a data word $u_1$, $u_2$, $u_3 = 1,0,1$ that is coded into the code word $v^{i-1} = (1,0,1) \cdot G = (1,0,1,0,0,1)$ by means of the coder Cod 21.

If the control signal st=0, the write-enable signal WE is activated and the address a is present on the address lines of the memory Sp 23a, then the code word 101001 is stored at the address a if no error is present.

Let us then assume that the first input line, which carries the data bit $u_1$, has a stuck-at-1 error. Since the written bit $u_1 = 1$, this error initially has no effect.

If then the read-enable signal is activated and the address a is present on the address lines of the memory Sp 23a, then $v^i = 101001$ is output on the output lines of the memory Sp 23a. This value 101001 is then present at the input of the error detection circuit FEm 25 and simultaneously at the input of the NOT circuit 24.

The control signal mod is equal to 0, such that the XOR circuit 26 passes on the signal 101001 without any change to the input of the error detection unit FE 27. Since 101001 is a code word of the code under consideration, the error detection unit FE 27 outputs an error signal $E=E_{nonerror}$, such that no error is indicated.

The value 010110 is provided at the output of the NOT circuit 24.

If the control signal of the multiplexer 22 is st=1, the write-enable signal WE is activated and the address a is present at the address inputs, then the signal 110110 is stored in the memory Sp 23a, wherein the first component is equal to 1 owing to the stuck-at-1 error present.

If then the read-enable signal RE is activated and the address a is present on the address lines of the memory Sp 23a, then the signal 110110 is read out from the memory Sp 23a and is present at the input of the error detection circuit FEm 25.

The control signal mod is now equal to 1, such that 110110 is inverted into 001001 in the XOR circuit 26 and is present at the input of the error detection unit FE 27.

Since 001001 is not a code word of the code under consideration, the error detection unit FE 27 outputs an error signal $E=E_{error}$, which indicates an error.

By way of example, in one specific embodiment of FIG. 5, FIG. 5 could show a configuration of the error detection circuit FEm 12 or 25 for a linear code.

Such a specific embodiment could comprise a syndrome generator Syn 51, a partial inverter paInv 52 and an OR circuit 53.

In such a specific embodiment of FIG. 5, the syndrome generator 51 could implement the equations $$s_1 = u_1 \oplus u_2 \oplus u_3 \oplus c_1,$$

$$s_2 = u_1 \oplus u_3 \oplus c_2,$$

$$s_3 = u_2 \oplus u_3 \oplus c_3.$$

Since $H \cdot (1,1,1,1,1,1)^T = (0,1,1)^T$ holds true, the partial inverter paInv 52 inverts the second and third components of the syndrome $s = s_1, s_2, s_3$, if mod=1.

The modified syndrome $s^* = (s^*_1, s^*_2, s^*_3)$ is then determined by $$s^*_1 = s_1 = u_1 \oplus u_2 \oplus u_3 \oplus c_1,$$

$$s^*_2 = s_2 \oplus \text{mod} = u_1 \oplus u_3 \oplus c_2 \oplus \text{mod}$$

$$s^*_3 = s_3 \oplus \text{mod} = u_2 \oplus u_3 \oplus c_3 \oplus \text{mod}$$

such that the bits $s_2$ and $s_3$ of the syndrome are inverted.

If then the word 101001 is present at the input of the error detection circuit FEm 12 and the control signal mod=0, then the syndrome generator forms the syndrome $(s_1, s_2, s_3) = H (1,0,1,0,0,1)^T = (0,0,0)$, which is not modified by the partial inverter paInv, with the result that $s^* = s = (0,0,0)$ holds true.

The OR circuit forms the error signal $OR(0,0,0) = 0 = E_{nonerror}$, such that no error is indicated.

If the value 110110 is then present (instead of the correct inverted value 010110) at the input of the syndrome generator Syn 51, then the syndrome generator Syn 51 outputs the syndrome $$s = H \cdot (110110)^T = (101)^T$$

at its output. Since the control signal mod=1, the second and third bits are inverted, such that $s^* = s \oplus 011 = 110$ holds true and the OR circuit 53 outputs an error signal $E=1=E_{error}$, such that the error that a stuck-at-1 error is present at the first data input of the memory is detected.

By way of example, in one specific embodiment of FIG. 10, FIG. 10 could show an exemplary embodiment in which the inversion of the memory word is accomplished in two steps. By way of example, it could be assumed e.g. that the partial inverter parInv1 110 inverts e.g. every second bit, that is to say adds the vector (101010) to the memory word $v^i$, and the partial inverter parInv2 120 in the second step inverts e.g. the other inputs, that is to say adds the vector (010101) to the memory word $v^i$.

Since the following holds true with the above H-matrix H:

$$(101010) \cdot H = (011)$$

$$(010101) \cdot H = (000)$$

the modified syndrome can be specified as follows:

$$s^*_1 = s_1 = u_1 \oplus u_2 \oplus u_3 \oplus c_1$$

$$s^*_2 = s_2 \oplus \text{mod} = u_1 \oplus u_3 \oplus c_2 \oplus \text{mod}$$

$$s^*_3 = s_3 \oplus \text{mod} = u_2 \oplus u_3 \oplus c_3 \oplus \text{mod}$$

such that the bits $s_2$ and $s_3$ of the syndrome are inverted. This modified syndrome is used both in the case of the error detection circuit FEm 140 and in the case of the correction circuit Kor 150. Since $$(010101) \cdot H = (000)$$

and the modified syndrome thus assumes the same values for the values mod=0 and mod=2, no second control line mod is required and it can be omitted in the case of the code used.

As a further exemplary embodiment, we will now consider an Hsiao code having four data bits $u_1$, $u_2$, $u_3$, $u_4$ and four check bits $c_1$, $c_2$, $c_3$, $c_4$ having the H-matrix $$H = \begin{pmatrix} 1 & 1 & 1 & 0 & 1 & 0 & 0 & 0 \\ 1 & 1 & 0 & 1 & 0 & 1 & 0 & 0 \\ 1 & 0 & 1 & 1 & 0 & 0 & 1 & 0 \\ 0 & 1 & 1 & 1 & 0 & 0 & 0 & 1 \end{pmatrix}.$$

For this code, the All-1 vector $(1,1,1,1,1,1,1,1)$ is a code word since $$H \cdot (1,1,1,1,1,1,1,1)^T = (0,0,0,0)^T.$$

The generator matrix of this code is $$G = \begin{pmatrix} 1 & 0 & 0 & 0 & 1 & 1 & 1 & 0 \\ 0 & 1 & 0 & 0 & 1 & 1 & 0 & 1 \\ 0 & 0 & 1 & 0 & 1 & 0 & 1 & 1 \\ 0 & 0 & 0 & 1 & 0 & 1 & 1 & 1 \end{pmatrix}.$$

The data word $(u_1, u_2, u_3, u_4) = (1,1,0,0)$ is converted into the code word $$(1,1,0,0) \cdot G = (1,1,0,0,0,0,1,1).$$

Since $(1,1,1,1,1,1,1,1)$ is a code word, $$(11000011) \oplus (11111111) = (00111100)$$

is also a code word.

By way of example, for explanation purposes reference could be made to FIG. 2c, for example, and it could be assumed that the code word (11000011) is stored in the memory Sp 23a at the address a and that no error is present.

If the address a is present on the address lines of the memory Sp 23a and the read-enable signal RE is activated, then the word 11000011 is output on the data lines of the memory Sp 23a and this word is thus present at the input of the inverter circuit 24 and at the input of the error detection circuit FEm 25. The control signal mod is equal to 0 and the error detection unit FE 27 outputs an error signal $E = E_{nonerror}$, thereby indicating that no error is present, since 11000011 is a code word.

The word 00111100 is formed at the output of the inverter circuit 24. If the control signal is st=1, the write-enable signal WE is activated and the address a is present at the address inputs of the memory Sp 23a, then the word 00111100 is now stored at the address a in the memory Sp 23a.

If then the read-enable signal RE is activated and the address a is furthermore present at the address input of the memory Sp 23a, then the word 00111100 is read out from the memory Sp 23a and is present at the input of the error detection circuit FEm 25. If the control signal mod is equal to 1, then the code word 00111100 is inverted into the code word 11000011 and this word is present at the error detection unit FE 27, which checks whether 00111100 is a code word.

Since that is the case, the error detection circuit FE 27 outputs an error signal $E = E_{nonerror}$ indicating that no error is present.

The same result also arises if the control signal mod is chosen to be equal to 0, since 11000011 is a code word and 11111111 is also a code word.

Therefore, if 11111111 is a code word of the binary code under consideration, then it is not necessary to use different control signals mod=0 or mod=1.

It is then possible always to use the control signal mod=0 or simply to omit the XOR circuit 26.

If the memory word is inverted in two steps as in the exemplary embodiment according to FIG. 10, then for example by contrast the control signal mod is required.

If it holds true, for example that:

$$(10101010) \cdot H = (1111)^T$$

$$(01010101) \cdot H = (1111)^T$$

the modified syndrome can be specified as follows $$s^*_1 = s_1 \oplus \mathrm{mod} = u_1 \oplus u_2 \oplus u_3 \oplus c_1 \oplus \mathrm{mod}$$

$$s^*_2 = s_2 \oplus \mathrm{mod} = u_1 \oplus u_2 \oplus u_4 \oplus c_2 \oplus \mathrm{mod}$$

$$s^*_3 = s_3 \oplus \mathrm{mod} = u_1 \oplus u_3 \oplus u_4 \oplus c_3 \oplus \mathrm{mod}$$

$$s^*_4 = s_3 \oplus \mathrm{mod} = u_2 \oplus u_3 \oplus u_4 \oplus c_4 \oplus \mathrm{mod}$$

such that the bits $s_1$, $s_2$, $s_3$ and $s_4$ of the syndrome are inverted for the error detection circuit FEm 140 and the error correction circuit Kor 150.

Although some aspects have been described in connection with a device, it goes without saying that these aspects also represent a description of the corresponding method, such that a block or a component of a device should also be understood as a corresponding method step or as a feature of a method step. Analogously to this, aspects which have been described in connection with a or as a method step also represent a description of a corresponding block or detail or feature of a corresponding device. Some or all of the method steps can be performed by a hardware apparatus (or using a hardware apparatus), such as, for example, a microprocessor, a programmable computer or an electronic circuit. In some exemplary embodiments, some or a plurality of the most important method steps can be performed by such an apparatus.

Depending on the specific implementation requirements, exemplary embodiments of the invention can be implemented in hardware or in software. The implementation can be effected using a digital storage medium, for example a floppy disk, a DVD, a Blu-ray disk, a CD, a ROM, a PROM, an EPROM, an EEPROM or a flash memory, a hard disk or some other magnetic or optical storage device on which electronically readable control signals are stored which can interact or do interact with a programmable computer system in such a way that the respective method is carried out. Therefore, the digital storage medium can be computer-readable.

Some exemplary embodiments according to the invention therefore comprise a data carrier having electronically readable control signals which are able to interact with a programmable computer system in such a way that one of the methods described herein is carried out.

Generally, exemplary embodiments of the present invention can be implemented as a computer program product comprising a program code, wherein the program code is effective for carrying out one of the methods if the computer program product runs on a computer.

The program code can also be stored on a machine-readable carrier, for example.

Other exemplary embodiments comprise the computer program for carrying out one of the methods described herein, wherein the computer program is stored on a machine-readable carrier. In other words, one exemplary embodiment of the method according to the invention is therefore a computer program comprising a program code for carrying out one of the methods described herein if the computer program runs on a computer.

A further exemplary embodiment of the methods according to the invention is therefore a data carrier (or a digital storage medium or a computer-readable medium) on which the computer program for carrying out one of the methods described herein is recorded.

A further exemplary embodiment of the method according to the invention is therefore a data stream or a sequence of signals representing the computer program for carrying out one of the methods described herein. The data stream or the sequence of signals can be configured, for example, for being transferred via a data communication connection, for example via the Internet.

A further exemplary embodiment comprises a processing device, for example a computer or a programmable logic component, which is configured or adapted for carrying out one of the methods described herein.

A further exemplary embodiment comprises a computer on which the computer program for carrying out one of the methods described herein is installed.

A further exemplary embodiment according to the invention comprises a device or a system designed to transmit a computer program for carrying out at least one of the methods described herein to a receiver. The transmission can be effected electronically or optically, for example. The receiver can be, for example, a computer, a mobile device, a memory device or a similar device. The device or the system can comprise, for example, a file server for transmitting the computer program to the receiver.

In some exemplary embodiments, a programmable logic component (for example a field programmable gate array, an FPGA) can be used to carry out some or all functionalities of the methods described herein. In some exemplary embodiments, a field programmable gate array can interact with a microprocessor in order to carry out one of the methods described herein. Generally, in some exemplary embodiments the methods are carried out on the part of an arbitrary hardware device. The latter can be universally usable hardware such as a computer processor (CPU) or hardware specific to the method, such as an ASIC, for example.

The exemplary embodiments described above merely constitute an illustration of the principles of the present invention. It goes without saying that modifications and variations of the arrangements and details described herein will be apparent to other persons skilled in the art. Therefore, it is intended that the invention should only be restricted by the scope of protection of the following patent claims and not by the specific details that have been presented on the basis of the description and the explanation of the exemplary embodiments herein.

LITERATURE

[1] Sundberg, C.-E. W., "Erasure and Error Decoding for Semiconductor Memories", IEEE Trans. Computers C-27, 696-705, August 1978.
[2] Carter, W. C. and McCarthy, C. E., "Implementation of an Experimental Fault-Tolerant Memory System", IEEE Trans. Computers C-25, 557-568, June 1976.
[3] Chen, C. and Hsiao, M. "Error Correcting Codes for Semiconductor Memory Application, a State of the Art Review", IBM Research and Development, Vol. 28, No. 2, March 1984.
[4] Lin, S. Costello D. "Error Control Coding", Prentice Hall, 1983

The invention claimed is:

1. A circuit arrangement for detecting memory errors, comprising:
   a memory; and
   an error detection circuit,
   wherein the circuit arrangement is designed to store a code word of an error detection code or a code word that is inverted in a subset of bits in the memory at a memory location and to read out a data word from the memory from the memory location,
   wherein the error detection circuit is designed, for a case where a control signal present assumes a first value, to indicate a memory error if the data word is not a code word of the error detection code, and
   wherein the error detection circuit is designed, for a case where the control signal present assumes a second value, which is different from the first value, and the code word that is inverted in the subset of bits was written to the memory location, to determine on the basis of the data word read out from the memory whether a memory error is present if the code word that is inverted in the subset of bits is not a code word of the error detection code.

2. The circuit arrangement as claimed in claim 1, wherein the circuit arrangement furthermore comprises:
   n data input lines; and
   n data output lines,
   the data word $v^i = v_1^i, \ldots, v_n^i$, which has n digits, onto the n data output lines, wherein in the memory location of the memory, before said data word is read out, the code word $v^{i-1} = v_1^{i-1}, \ldots, v_n^{i-1}$ of the error detection code, said code word being present on the n data input lines, was written to said memory location, or wherein a word $v_M^{i-1}$ having n digits was written to the memory location of the memory, wherein the word $v_M^{i-1}$ is formed by inversion of the bits of the subset of bits, wherein the subset of bits is a non-empty subset of bits, from a code word $v^{i-1}$ of the code, wherein, after the word $v^{i-1}$ or the word $v_M^{i-1}$ was written to a memory location in the memory, no further data word was written to said memory location in the memory until the data word $v^i$ was read from said memory location from the memory.

3. The circuit arrangement as claimed in claim 2, wherein the code has a code distance d, d≥2, and i≥2 and n≥4.

4. The circuit arrangement as claimed in claim 2,
   wherein the error detection circuit is designed, depending on the value of the control signal present if an n-digit code word $v^{i-1}$ of the code was written to the memory before the n-digit data word $v^i$ is read out, to indicate an error if the data word $v^i$ read out is not a code word of the code; and
   wherein the error detection circuit is designed, if the word $v_M^{i-1}$ having n digits was written to the memory before the n-digit data word $v^i$ is read out, if $v_M^{i-1}$ is a code word of the code, and if the subset does not comprise all n bits, to indicate an error if the word $v^i$ read out from the memory is not a code word of the code,
   wherein the error detection circuit is designed, if the word $v_M^{i-1}$ having n digits was written to the memory before the n-digit data word $v^i$ is read out, if $v_M^{i-1}$ is not a code word of the code, to indicate an error if the word $v_M^i$ formed from the word $v^i$ read out from the memory, said word $v_M^i$ being formed from $v^i$ by inversion of the bits belonging to the subset M, is not a code word of the code, wherein the control signal mod present assumes the first value if a code word $v^{i-1}$ of the code was input before the data word is read out, or if a word $v_M^{i-1}$ formed by inversion of the bits belonging to the subset from a code word of the code was input into the memory before the data word is read out, and if the word $v_M^{i-1}$ is a code word of the code, in which case $v_M^{i-1}$ is a code word of the code and the subset is a proper subset of all the bits, and wherein the control signal mod present assumes the second value, which is different from the first value, if a word $v_M^{i-1}$ formed by inversion of the bits belonging to the subset from a code word of the code was input into the memory before the data word $v^i$ is read out, and the word $v_M^{i-1}$ is not a code word of the code.

5. The circuit arrangement as claimed in claim 2, wherein the non-empty subset consists of all n bits and $v_M^{i-1} = \overline{v_1^{i-1}}, \ldots, \overline{v_n^{i-1}}$ holds true.

6. The circuit arrangement as claimed in claim 2, wherein the non-empty subset comprises every second bit and either $v_M^{i-1} = \overline{v_1^{i-1}}, v_2^{i-1}, \overline{v_3^{i-1}}, v_4^{i-1}, \ldots, \overline{v_{n-1}^{i-1}}, v_n^{i-1}$ or $v_M^{i-1} = v_1^{i-1}, \overline{v_2^{i-1}}, v_3^{i-1}, \overline{v_4^{i-1}}$ holds true.

7. The circuit arrangement as claimed in claim 1, wherein the memory is an addressable memory having an address input, wherein the memory location written to and the memory location read from are determined by an address.

8. The circuit arrangement as claimed in claim 7, wherein the memory is a RAM.

9. The circuit arrangement as claimed in claim 7, wherein the memory is an MRAM.

10. The circuit arrangement as claimed in claim 7, wherein the memory is a register array.

11. The circuit arrangement as claimed in claim 1, wherein the memory is a register having at least the length n of the code.

12. The circuit arrangement as claimed in claim 11, wherein the register is constructed from flip-flops.

13. The circuit arrangement as claimed in claim 11, wherein the register is constructed from latches.

14. The circuit arrangement as claimed in claim 1, wherein a digit-by-digit inverted word $\overline{v}^{i-1} = \overline{v_1}^{i-1} \ldots, \overline{v_n}^{i-1}$ of a code word $v^{i-1} = v_1^{i-1} \ldots, v_n^{i-1}$ is not a code word of the code.

15. The circuit arrangement as claimed in claim 1, wherein inverters are connected upstream of a non-empty subset of input lines of the memory and NOT circuits are disposed downstream of the corresponding output lines of the memory.

16. The circuit arrangement as claimed in claim 1, wherein the code is a nonlinear code.

17. The circuit arrangement as claimed in claim 1, wherein the code is a linear code.

18. The circuit arrangement as claimed in claim 17, wherein the code is a linear code having the length n with k data bits, and the code is an H-matrix H with k rows and n columns, wherein k<n, and
wherein the error detection circuit has as subcircuit a syndrome generator Syn configured such that, depending on the data $v^i = v_1^i, \ldots, v_n^i$ read out from the memory and a binary control variable mod, said syndrome generated determines a k-digit error syndrome $s(v^i)$ according to the relationship $$s(v^i) = H \cdot [v^i \oplus \mathrm{mod} \cdot (u_1, \ldots, u_n)]^T = H \cdot (v^i)^T \oplus \{\mathrm{mod} \cdot H \cdot (u_1, \ldots, u_n)^T\},$$

mod=0 if a code word $v^{i-1}$ of the code was written to the memory at the address a or if an n-digit word $v_M^{i-1}$ was written to the memory, wherein the word $v_M^{i-1}$ is formed by inversion of the bits of a non-empty subset of bits from a code word $v^{i-1}$ of the code and $v_M^{i-1}$ is a code word of the code, and mod=1 if an n-digit word $v_M^{i-1}$ was written to the memory, wherein the word $v_M^{i-1}$ is formed by inversion of the bits of a non-empty subset of bits from a code word $v^{i-1}$ of the code and $v_M^{i-1}$ is not a code word of the code, and
wherein $(v^i)^T$ is an n-component binary column vector comprising the components $v_1^i, \ldots, v_n^i$ and $(u_1, \ldots, u_n)^T$ is an n-component binary column vector comprising the components $u_1, \ldots, u_n$, wherein the following holds true for i=1, . . . , n:
$u_i=1$ for $u_i \in M$ and $u_i=0$ for $u_i \notin M$, and
wherein $H \cdot (v^i)^T \oplus \{\mathrm{mod} \cdot H \cdot (u_1, \ldots, u_n)^T\}$ represents the component-by-component XORing of the k-digit vectors $H \cdot (v^i)^T$ and $\{\mathrm{mod} \cdot H \cdot (u_i, \ldots, u_n)^T\}$ and $[v^i \oplus \mathrm{mod} \cdot (u_1, \ldots, u_n)]^T$ is the digit-by-digit XOR ing of the n-digit vectors $v^i$ and $\mathrm{mod} \cdot (u_1, \ldots, u_n)^T$ and mod=1 holds true if $$H \cdot (u_1, \ldots, u_n)^T \neq 0.$$

19. A circuit arrangement for testing and detecting memory errors in a memory using arbitrary useful data stored in memory, comprising the memory and an error detection circuit,
wherein the circuit arrangement is designed to write a code word of an error detection code to a memory location of the memory and to store it, wherein the circuit arrangement is furthermore designed to read out a data word stored in the memory at a memory location, and wherein the circuit arrangement is furthermore designed to invert a non-empty subset of bits of a data word which was read out from the memory and to write the read-out data word whose non-empty subset of bits were inverted to the memory location at which the read-out data word was stored,
wherein the error detection circuit is designed to indicate an error depending on a value of a control signal,
is designed, if the control signal assumes a first value, to indicate a memory error if the data word read out from the memory is not a code word of the error detection code,
wherein the error detection circuit is designed, if the control signal assumes a second value, to indicate a memory error if the data word that is read out from the memory and is inverted in the subset of bits is not a code word of the error detection code,
wherein the control signal assumes the first value if a code word was written to the memory location of the memory from which the data word was read out,
wherein the control signal assumes the second value if the data word that is inverted in the subset M of bits and read out from the memory was written to the memory location from which the data word is read out and if a code word of the error detection code, said code word being inverted in the subset M of bits, is not a code word of the error detection code, wherein the first value of the control signal is different from the second value of the control signal, and
wherein the subset M is a proper subset of all the bits of a data word if a code word that is inverted in the subset M of bits is a code word of the error detection code.

20. The circuit arrangement as claimed in claim 19, wherein the code is a linear code.

21. A circuit arrangement, wherein the circuit arrangement comprises:

a memory;

an error detection circuit;

n data input lines; and n data output lines, a data word $v^i = v_1^i, \ldots, v_n^i$, which has n digits, onto the n data output lines, wherein in the memory location of the memory, before said data word is read out, a code word $v^{i-1} = v_1^{i-1}, \ldots, v_n^{i-1}$ of the error detection code, said code word being present on the n data input lines, was written to said memory location, or wherein a word $v_M^{i-1}$ having n digits was written to the memory location of the memory, wherein the word $v_M^{i-1}$ is formed by inversion of the bits of a non-empty subset M of bits from a code word $v^{i-1}$ of the code, wherein, after the word $v^{i-1}$ or the word $v_M^{i-1}$ was written to a memory location in the memory, no further data word was written to said memory location in the memory until the data word $v^i$ was read from said memory location from the memory, wherein the code has a code distance d, d≥2, and i≥2 and n≥4, wherein the error detection circuit is designed, depending on the value of the control signal if an n-digit code word $v^{i-1}$ of the code was written to the memory before the n-digit data word $v^i$ is read out, to indicate an error if the data word $v^i$ read out is not a code word of the code; and wherein the error detection circuit is designed, if the word $v_M^{i-1}$ having n digits was written to the memory before the n-digit data word $v^i$ is read out, if $v_M^{i-1}$ is a code word of the code and if the subset M does not comprise all n bits, to indicate an error if the word $v^i$ read out from the memory is not a code word of the code, wherein the error detection circuit is designed, if the word $v_M^{i-1}$ having n digits was written to the memory before the n-digit data word $v^i$ is read out, if $v_M^{i-1}$ is not a code word of the code, to indicate an error if the word $v_M^i$ formed from the word $v^i$ read out from the memory, said word $v_M^i$ being formed from $v^i$ by inversion of the bits belonging to the subset M, is not a code word of the code, wherein the control signal mod assumes the first value if a code word $v^{i-1}$ of the code was input before the data word is read out, or if a word $v_M^{i-1}$ formed by inversion of the bits belonging to the subset M from a code word of the code was input into the memory before the data word is read out, and if the word $v_M^{i-1}$ is a code word of the code, in which case $v_M^{i-1}$ is a code word of the code and the subset M is a proper subset of all the bits, wherein the control signal mod assumes the second value, which is different from the first value, if a word $v_M^{i-1}$ formed by inversion of the bits belonging to the subset M from a code word of the code was input into the memory before the data word $v^i$ is read out, and the word $v_M^{i-1}$ is not a code word of the code, and wherein the code is a linear code.

22. A circuit arrangement for detecting memory errors, comprising:

a memory; and an error detection circuit, wherein the error detection circuit is designed for determining errors in the memory, wherein the memory is designed to the effect that in the memory useful data bits $u = u_1, \ldots, u_k$ are stored as a code word $v = v_1, \ldots, v_n$ of a code having the length n with k information bits with the code distance d≥2, wherein there are q subsets $M_1 = \{v_{1,1}, \ldots, v_{1,n1}\}, \ldots, M_q = \{v_{q,1}, \ldots, v_{q,nq}\}$ where q≥1 and $n_i \leq n$ for $i = 1, \ldots, q$ of the set $M = \{v_1, \ldots, v_n\}$ of the n components of the code word $v = v_1, \ldots, v_n$, and at least one of the values $n_1, \ldots, n_q$ is less than n, wherein $M_1 \cup M_2 \cup \ldots \cup M_k = M$ holds true and such that if $v = v_1, \ldots, v_n$ is a code word of the code, for $i = 1, \ldots, q$ it is also the case that $v^{Mi} = v_1^i \ldots, v_n^i$ is a code word of the code, wherein $v^{Mi}$ is formed from v such that the components of v which are an element of $M_i$ are inverted and the components of v which are not an element of $M_i$ are not inverted, and wherein the circuit arrangement is designed to store, in a first step, a code word $v^1 = V_1^1, \ldots, v_n^1$ of the code at an address a in the memory, wherein the circuit arrangement is furthermore designed to read out, in a second step, a word $v^2 = v_1^2, \ldots, v_n^2$, stored at the address a in the memory, wherein the circuit arrangement is designed to carry out the second step after the first step, and wherein, between the first step and the second step, no further word is written to the memory at the address a, wherein the error detection circuit is designed to check, in a third step, whether $v^2$ is a code word of the code and, if $v^2$ is not a code word of the code, to indicate an error and to end the processing and, if $v^2$ is a code word of the code, to indicate no error and to continue the processing, wherein the circuit arrangement is furthermore designed to store, in a fourth step, a code word $v^3 = (v^2)^{M1}$ at the address a in the memory, wherein $v^3 = (v^2)^{M1}$ is determined from $v^2$ such that the components $v_i^2$ where $i \in \{1, \ldots, n\}$ of $v^2$ which belong to $M^1$ are inverted and all the components which do not belong to $M^1$ are not inverted, if it has been established in the third step that $v^2$ is a code word of the code, wherein the circuit arrangement is furthermore designed to read out, in a fifth step, a word $v^4$ stored at the address a, wherein the circuit arrangement is designed to carry out the fifth step after the fourth step, and wherein, between the fourth step and the fifth step, no further word is written to the memory at the address a, wherein the error detection circuit is furthermore designed to check, in a sixth step, whether $v^4$ is a code word of the code and, if $v^4$ is not a code word of the code, to indicate an error and to end the method and, if $v^4$ is a code word of the code, to indicate no error, and wherein the code is a linear code.

23. A circuit arrangement for detecting memory errors, comprising:

a memory; and an error detection circuit, wherein the error detection circuit is designed for determining errors in the memory, wherein the memory is designed to an effect that in the memory useful data bits $u = u_1, \ldots, u_k$ are stored as a code word $v = v_1, \ldots, v_n$ of a code having a length n with k information bits with the code distance d≥2, wherein there are q subsets $M_1 = \{v_{1,1}, \ldots, v_{1,n1}\}, \ldots, M_q = \{v_{q,1}, \ldots, v_{q,nq}\}$ where q≥1 and $n_i \leq n$ for $i = 1, \ldots, q$ of the set $M = \{v_1, \ldots, v_n\}$ of the n components of the code word $v = v_1, \ldots, v_n$, and at least one of the values $n_1, \ldots, n_q$ is less than n, wherein $M_1 \cup M_2 \cup \ldots \cup M_k = M$ holds true and such that if $v = v_1, \ldots, v_n$ is a code word of the code, for $i = 1, \ldots, q$ it is also the case that $v^{Mi} = v_1^i, \ldots, v_n^i$ is a code word of the code, wherein $v^{Mi}$ is formed from v such that the components of v which are an element of $M_i$ are inverted and the components of v which are not an element of $M_i$ are not inverted, and wherein the circuit arrangement is designed to store, in a first step, a code word $v^1=v_1^1, \ldots, v_n^1$ of the code at an address a in the memory, wherein the circuit arrangement is furthermore designed to read out, in a second step, a word $v^2=v_1^2, \ldots, v_n^2$, stored at the address a in the memory, wherein the circuit arrangement is designed to carry out the second step after the first step, and wherein, between the first step and the second step, no further word is written to the memory at the address a, wherein the error detection circuit is designed to check, in a third step, whether $v^2$ is a code word of the code and, if $v^2$ is not a code word of the code, to indicate an error and, if $v^2$ is a code word of the code, to indicate no error, wherein the circuit arrangement is furthermore designed to store, in a fourth step, which is carried out after the third step, a code word $v^3=(v^2)^{M1}$ at the address a in the memory, wherein $v^3=(v^2)^{M1}$ is determined from $v^2$ such that the components $v_i^2$ where $i \in \{1, \ldots, n\}$ of $v^2$ which belong to $M^1$ are inverted and all the components which do not belong to $M^1$ are not inverted, wherein the circuit arrangement is furthermore designed to read out, in a fifth step, a word $v^4$ stored at the address a, wherein the circuit arrangement is designed to carry out the fifth step after the fourth step, and wherein, between the fourth step and the fifth step, no further word is written to the memory at the address a, wherein the error detection circuit is furthermore designed to check, in a sixth step, whether $v^4$ is a code word of the code and, if $v^4$ is not a code word of the code, to indicate an error and, if $v^4$ is a code word of the code, to indicate no error, and wherein the code is a linear code.

24. A method for detecting memory errors, comprising:

storing a code word of an error detection code or a code word that is inverted in a subset of bits in the memory at a memory location, reading out a data word from the memory from the memory location, indicating a memory error if the data word is not a code word of the error detection code, if a control signal assumes a first value, and for the case where the control signal assumes a second value, which is different from the first value, and the code word that is inverted in the subset of bits was written to the memory location, determining on the basis of the data word read out from the memory whether a memory error is present if the code word that is inverted in the subset of bits is not a code word of the error detection code.

25. A method for determining errors in a memory, in which useful data bits $u=u_1, \ldots, u_k$ are stored as a code word $v=v_1, \ldots, v_n$ of a code having the length n with k information bits and with the code distance $d \geq 2$, wherein there are q subsets $M_1=(v_{1,1}, \ldots, v_{1,n1}), \ldots, M_q= \{v_{q,1}, \ldots, v_{q,nq}\}$ where $q \geq 1$ and $ni \leq n$ for $i=1, \ldots, q$ of the set $M=\{v_1, \ldots, v_n\}$ of the n components of the code word $v=v_1, \ldots, v_n$, wherein $M_1 \cup M_2 \cup \ldots \cup M_k=M$ holds true and such that if $v=v_1, \ldots, v_n$ is a code word of the code, for $i=1, \ldots, q$ it is also the case that $v^{Mi}=v_1^i, \ldots, v_n^i$ is a code word of the code, and at least one of the values $n_1, \ldots, n_q$ is less than n wherein $v^{Mi}$ is formed from v such that the components of v which are an element of $M_i$ are inverted and the components of v which are not an element of $M_i$ are not inverted, wherein the method comprises:

storing, by a circuit arrangement in a first step, a code word $v^1=v_1^1, \ldots, v_n^1$ of the code at an address a in the memory, reading out, by the circuit arrangement in a second step, a word $v^2=v_1^2, \ldots, v_n^2$ stored at the address a in the memory, wherein this second step is carried out after the first step, and wherein, between the first step and the second step, no further word was written to the memory at the address a, checking, by an error detection circuit in a third step, whether $v^2$ is a code word of the code, wherein, if $v^2$ is not a code word of the code, an error is indicated and the method is ended, and wherein, if $v^2$ is a code word of the code, no error is indicated and the method is continued, storing, by the circuit arrangement in a fourth step, a code word $v^3=(v^2)^{M1}$ at the address a in the memory, wherein $v^3=(v^2)^{M1}$ is determined from $v^2$ such that the components $v_i^2$ where $i \in \{1, \ldots, n\}$ of $v^2$ which belong to $M^1$ are inverted and all the components which do not belong to $M^1$ are not inverted, if it has been established in the third step that $v^2$ is a code word of the code, reading out, by the circuit arrangement in a fifth step, a word $v^4$ stored at the address a, wherein the fifth step is carried out after the fourth step and, between the fourth step and the fifth step, no further word is written to the memory at the address a, and checking, by the error detection circuit in a sixth step, whether $v^4$ is a code word of the code, wherein, if $v^4$ is not a code word of the code, an error is indicated and the method is ended, and wherein, if $V^4$ is a code word of the code, no error is indicated.

26. A method for determining errors in a memory, in which useful data bits $u=u_1, \ldots, u_k$ are stored as a code word $v=v_1, \ldots, v_n$ of a code having the length n with k information bits and with the code distance $d \geq 2$, wherein there are q subsets $M_1=\{v_{1,1}, \ldots, v_{1,n1}\}), \ldots, M_q= \{v_{q,1}, \ldots, v_{q,nq}\}$ where $q \geq 1$ and $ni \leq n$ for $i=1, \ldots, q$ of the set $M=\{v_1, \ldots, v_n\}$ of the n components of the code word $v=v_1, \ldots, v_n$, wherein $M_1 \cup M_2 \cup \ldots \cup M_k=M$ holds true and such that if $v=v_1, \ldots, v_n$ is a code word of the code, for $i=1, \ldots, q$ it is also the case that $v^{Mi}=v_1^i, \ldots, v_n^i$ is a code word of the code and at least one of the values $n_1, \ldots, n_q$ is less than n, wherein $v^{Mi}$ is formed from v such that the components of v which are an element of $M_i$ are inverted and the components of v which are not an element of $M_i$ are not inverted, wherein the method comprises:

storing, by a circuit arrangement in a first step, a code word $v^1=v_1^1, \ldots, v_n^1$ of the code at an address a in the memory, reading, by the circuit arrangement in a second step, out a word $v^2=v_1^2, \ldots, v_n^2$ stored at the address a in the memory, wherein this second step is carried out after the first step, and wherein, between the first step and the second step, no further word was written to the memory at the address a, checking, by an error detection circuit in a third step, whether $v^2$ is a code word of the code, wherein, if $v^2$ is not a code word of the code, an error is indicated, and wherein, if $v^2$ is a code word of the code, no error is indicated, storing, by the circuit arrangement in a fourth step, a code word $v^3=(v^2)^{M1}$ at the address a in the memory, wherein $v^3=(v^2)^{M1}$ is determined from $v^2$ such that the components $v_i^2$ where $i \in \{1, \ldots, n\}$ of $v^2$ which belong to $M^1$ are inverted and all the components which do not belong to $M^1$ are not inverted, reading out, by the circuit arrangement in a fifth step, a word $v^4$ stored at the address a, wherein the fifth step is carried out after the fourth step and, between the fourth step and the fifth step, no further word is written to the memory at the address a, and checking, by the error detection circuit in a sixth step, whether $v^4$ is a code word of the code, wherein, if $v^4$ is not a code word of the code, an error is indicated, and wherein, if $v^4$ is a code word of the code, no error is indicated.

* * * * *